(12) United States Patent
Mayer et al.

(10) Patent No.: US 8,475,644 B2
(45) Date of Patent: *Jul. 2, 2013

(54) METHOD AND APPARATUS FOR ELECTROPLATING

(75) Inventors: Steven Mayer, Lake Oswego, OR (US); Jingbin Feng, Lake Oswego, OR (US); Zhian He, Tigard, OR (US); Jonathan Reid, Sherwood, OR (US); Seshasayee Varadarajan, Lake Oswego, OR (US)

(73) Assignee: Novellus Systems, Inc., Fremont, CA (US)

( * ) Notice: Subject to any disclaimer, the term of this patent is extended or adjusted under 35 U.S.C. 154(b) by 125 days.

This patent is subject to a terminal disclaimer.

(21) Appl. No.: 12/606,030

(22) Filed: Oct. 26, 2009

(65) Prior Publication Data

US 2010/0044236 A1 Feb. 25, 2010

Related U.S. Application Data

(63) Continuation of application No. 12/481,503, filed on Jun. 9, 2009, which is a continuation-in-part of application No. 12/291,356, filed on Nov. 7, 2008, now Pat. No. 8,308,931, application No. 12/606,030, which is a continuation-in-part of application No. 11/213,190, filed on Aug. 26, 2005, now Pat. No. 7,686,935, which is a continuation-in-part of application No. 10/274,755, filed on Oct. 21, 2002, (Continued)

(51) Int. Cl.
*C25D 21/12* (2006.01)
*C25D 7/12* (2006.01)
*C25D 3/38* (2006.01)

(52) U.S. Cl.
USPC .... 205/96; 204/228.9; 204/229.4; 204/230.7; 204/DIG. 7; 205/123

(58) Field of Classification Search
USPC ....... 204/228.9, 229.4, 230.7, DIG. 7; 205/96
See application file for complete search history.

(56) References Cited

U.S. PATENT DOCUMENTS 3,652,442 A 3/1972 Powers et al.
3,706,651 A 12/1972 Leland (Continued)

FOREIGN PATENT DOCUMENTS

CA 1 236 627 7/1986
EP 0037325 3/1981

(Continued)

OTHER PUBLICATIONS

Fang et al., "Uniform Copper Electroplating on Resistive Substrates," Abs. 167, 205th Meeting, © 2004 The Electrochemical Society, Inc., 1 page.

(Continued)

*Primary Examiner* — Patrick Ryan
*Assistant Examiner* — William Leader
(74) *Attorney, Agent, or Firm* — Weaver Austin Villeneuve & Sampson LLP

(57) ABSTRACT

An apparatus for electroplating a layer of metal onto the surface of a wafer includes an ionically resistive ionically permeable element located in close proximity of the wafer and an auxiliary cathode located between the anode and the ionically resistive ionically permeable element. The ionically resistive ionically permeable element serves to modulate ionic current at the wafer surface. The auxiliary cathode is configured to shape the current distribution from the anode. The provided configuration effectively redistributes ionic current in the plating system allowing plating of uniform metal layers and mitigating the terminal effect.

20 Claims, 20 Drawing Sheets

Related U.S. Application Data now Pat. No. 7,070,686, which is a continuation-in-part of application No. 09/542,890, filed on Apr. 4, 2000, now Pat. No. 6,514,393, and a continuation-in-part of application No. 10/116,077, filed on Apr. 4, 2002, now Pat. No. 6,755,954, which is a continuation-in-part of application No. 09/537,467, filed on Mar. 27, 2000, now Pat. No. 6,402,923, said application No. 11/213,190 is a continuation-in-part of application No. 10/916,374, filed on Aug. 10, 2004, now Pat. No. 6,919,010, which is a continuation-in-part of application No. 10/154,082, filed on May 22, 2002, now Pat. No. 6,773,571.

(60) Provisional application No. 60/580,572, filed on Jun. 16, 2004, provisional application No. 60/302,111, filed on Jun. 28, 2001.

(56) References Cited

U.S. PATENT DOCUMENTS

| | | |
|---|---|---|
| 3,862,891 A | 1/1975 | Smith |
| 3,880,725 A | 4/1975 | Van Raalte et al. |
| 4,033,833 A | 7/1977 | Bestel et al. |
| 4,082,638 A | 4/1978 | Jumer |
| 4,240,886 A | 12/1980 | Hodges et al. |
| 4,272,335 A | 6/1981 | Combs |
| 4,304,641 A | 12/1981 | Grandia et al. |
| 4,389,297 A | 6/1983 | Korach |
| 4,409,339 A | 10/1983 | Matsuda et al. |
| 4,469,564 A | 9/1984 | Okinaka et al. |
| 4,545,877 A | 10/1985 | Hillis |
| 4,604,177 A | 8/1986 | Sivilotti |
| 4,604,178 A | 8/1986 | Fiegener et al. |
| 4,605,482 A | 8/1986 | Shiragami et al. |
| 4,696,729 A | 9/1987 | Santini |
| 4,828,654 A | 5/1989 | Reed |
| 4,906,346 A | 3/1990 | Hadersbeck et al. |
| 4,931,149 A | 6/1990 | Stierman et al. |
| 4,933,061 A | 6/1990 | Kulkarni et al. |
| 4,988,417 A | 1/1991 | DeYoung |
| 5,035,784 A | 7/1991 | Anderson et al. |
| 5,039,381 A | 8/1991 | Mullarkey |
| 5,078,852 A | 1/1992 | Yee et al. |
| 5,096,550 A | 3/1992 | Mayer et al. |
| 5,146,136 A | 9/1992 | Ogura et al. |
| 5,156,730 A | 10/1992 | Bhatt et al. |
| 5,162,079 A | 11/1992 | Brown |
| 5,169,684 A | 12/1992 | Takagi |
| 5,217,586 A | 6/1993 | Datta et al. |
| 5,312,352 A | 5/1994 | Leschinsky et al. |
| 5,312,532 A | 5/1994 | Andricacos et al. |
| 5,316,642 A | 5/1994 | Young, Jr. et al. |
| 5,368,711 A | 11/1994 | Poris |
| 5,391,285 A | 2/1995 | Lytle et al. |
| 5,421,987 A | 6/1995 | Tzanavaras et al. |
| 5,443,707 A | 8/1995 | Mori |
| 5,472,592 A | 12/1995 | Lowery |
| 5,476,578 A | 12/1995 | Forand |
| 5,498,325 A | 3/1996 | Nishimura et al. |
| 5,516,412 A | 5/1996 | Andricacos et al. |
| 5,567,300 A | 10/1996 | Datta et al. |
| 5,620,581 A | 4/1997 | Ang |
| 5,660,699 A | 8/1997 | Saito et al. |
| 5,723,028 A | 3/1998 | Poris |
| 5,744,019 A | 4/1998 | Ang |
| 5,774,019 A | 6/1998 | Koyama et al. |
| 5,935,402 A | 8/1999 | Fanti |
| 6,004,440 A | 12/1999 | Hanson et al. |
| 6,027,631 A | 2/2000 | Broadbent |
| 6,071,388 A | 6/2000 | Uzoh |
| 6,074,544 A | 6/2000 | Reid et al. |
| 6,080,291 A | 6/2000 | Woodruff et al. |
| 6,099,702 A | 8/2000 | Reid et al. |
| 6,106,687 A * | 8/2000 | Edelstein .................. 205/98 |
| 6,110,346 A | 8/2000 | Reid et al. |
| 6,126,798 A | 10/2000 | Reid et al. |
| 6,132,587 A | 10/2000 | Jorne et al. |
| 6,132,805 A * | 10/2000 | Moslehi .................. 427/248.1 |
| 6,156,167 A | 12/2000 | Patton et al. |
| 6,162,344 A | 12/2000 | Reid et al. |
| 6,168,693 B1 | 1/2001 | Uzoh et al. |
| 6,174,425 B1 | 1/2001 | Simpson et al. |
| 6,179,983 B1 | 1/2001 | Reid et al. |
| 6,193,860 B1 | 2/2001 | Weling |
| 6,228,231 B1 | 5/2001 | Uzoh |
| 6,251,255 B1 | 6/2001 | Copping et al. |
| 6,261,433 B1 | 7/2001 | Landau |
| 6,322,674 B1 | 11/2001 | Berner et al. |
| 6,368,475 B1 | 4/2002 | Hanson et al. |
| 6,391,166 B1 | 5/2002 | Wang |
| 6,391,188 B1 | 5/2002 | Goosey |
| 6,395,152 B1 | 5/2002 | Wang |
| 6,398,926 B1 | 6/2002 | Mahneke |
| 6,402,923 B1 | 6/2002 | Mayer et al. |
| 6,497,801 B1 | 12/2002 | Woodruff et al. |
| 6,514,393 B1 | 2/2003 | Contolini et al. |
| 6,521,102 B1 | 2/2003 | Dordi |
| 6,527,920 B1 | 3/2003 | Mayer et al. |
| 6,551,483 B1 | 4/2003 | Mayer et al. |
| 6,569,299 B1 | 5/2003 | Reid et al. |
| 6,599,412 B1 | 7/2003 | Graham et al. |
| 6,627,051 B2 | 9/2003 | Berner et al. |
| 6,632,335 B2 | 10/2003 | Matsuda et al. |
| 6,716,334 B1 | 4/2004 | Reid et al. |
| 6,755,954 B2 | 6/2004 | Mayer et al. |
| 6,773,571 B1 | 8/2004 | Mayer et al. |
| 6,821,407 B1 | 11/2004 | Reid et al. |
| 6,843,894 B2 | 1/2005 | Berner et al. |
| 6,890,416 B1 | 5/2005 | Mayer et al. |
| 6,919,010 B1 | 7/2005 | Mayer et al. |
| 6,921,468 B2 | 7/2005 | Graham et al. |
| 6,964,792 B1 | 11/2005 | Mayer et al. |
| 7,070,686 B2 | 7/2006 | Contolini et al. |
| D533,104 S | 12/2006 | Ho |
| 7,169,705 B2 | 1/2007 | Ide et al. |
| D544,452 S | 6/2007 | Nakamura et al. |
| D548,705 S | 8/2007 | Hayashi |
| D552,565 S | 10/2007 | Nakamura et al. |
| 7,323,094 B2 | 1/2008 | Simpson et al. |
| D587,222 S | 2/2009 | Sasaki et al. |
| 7,622,024 B1 | 11/2009 | Mayer et al. |
| 7,641,776 B2 | 1/2010 | Nagar et al. |
| D609,652 S | 2/2010 | Nagasaka et al. |
| D609,655 S | 2/2010 | Sugimoto |
| 7,670,465 B2 | 3/2010 | Yang et al. |
| 7,682,498 B1 | 3/2010 | Mayer et al. |
| D614,593 S | 4/2010 | Lee et al. |
| 7,837,841 B2 | 11/2010 | Chen et al. |
| 7,854,828 B2 | 12/2010 | Reid et al. |
| 7,935,240 B2 | 5/2011 | Singh et al. |
| 7,967,969 B2 | 6/2011 | Mayer et al. |
| D648,289 S | 11/2011 | Mayer et al. |
| 2002/0017456 A1 | 2/2002 | Graham et al. |
| 2002/0020627 A1 | 2/2002 | Kunisawa et al. |
| 2002/0119671 A1 | 8/2002 | Lee |
| 2002/0125141 A1 * | 9/2002 | Wilson et al. .................. 205/96 |
| 2003/0029527 A1 | 2/2003 | Yajima et al. |
| 2003/0038035 A1 * | 2/2003 | Wilson et al. .................. 205/96 |
| 2003/0102210 A1 | 6/2003 | Woodruff et al. |
| 2003/0201166 A1 | 10/2003 | Zheng et al. |
| 2004/0149584 A1 | 8/2004 | Nagai et al. |
| 2005/0145499 A1 | 7/2005 | Kovarsky et al. |
| 2006/0243598 A1 * | 11/2006 | Singh et al. .................. 205/260 |
| 2007/0029193 A1 | 2/2007 | Brcka |
| 2007/0068819 A1 | 3/2007 | Singh et al. |
| 2007/0238265 A1 | 10/2007 | Kurashina et al. |
| 2010/0032304 A1 | 2/2010 | Mayer et al. |
| 2010/0032310 A1 | 2/2010 | Reid et al. |
| 2010/0044236 A1 | 2/2010 | Mayer et al. |
| 2010/0116672 A1 | 5/2010 | Mayer et al. |
| 2011/0031112 A1 | 2/2011 | Birang et al. |
| 2012/0000786 A1 | 1/2012 | Mayer et al. |

FOREIGN PATENT DOCUMENTS

| | | |
|---|---|---|
| JP | 59-162298 | 9/1984 |
| JP | 09-53197 | 2/1997 |
| JP | 20021316887 | 11/2001 |
| JP | 2003-268591 | 9/2003 |
| WO | WO 99/14401 | 3/1999 |
| WO | WO/9941434 | 8/1999 |
| WO | WO 99/64647 | 12/1999 |

OTHER PUBLICATIONS

Malmstadt et al. "Microcomputers and Electronic Instrumentation: Making the Right Connections" American Chemical Society (1994) p. 255.

International Search Report and Written Opinion for Application No. PCT/US2010/037520 dated Jan. 12, 2011.

U.S. Final Office Action dated Feb. 27, 2012 issued in U.S. Appl. No. 12/291,356.

U.S. Final Office Action dated Mar. 1, 2012 issued in U.S. Appl. No. 12/481,503.

Mayer et al., "High Resistance Ionic Current Source" Novellus Systems, Inc., U.S. Appl. No. 13/110,759, filed May 18, 2011.

U.S. Office Action for U.S. Appl. No. 12/291,356 mailed Sep. 19, 2011.

"Release of Sabre™ electrofill tool with HRVA by Novellus Systems, Inc.", dated prior to the filed of the instant application (3 pages).

US Office Action, dated Oct. 5, 2012, issued in U.S. Appl. No. 13/110,759.

U.S. Notice of Allowance dated Aug. 13, 2010 issued in U.S. Appl. No. 11/506,054.

U.S. Notice of Allowance dated Jul. 27, 2012 issued in U.S. Appl. No. 12/291,356.

U.S. Office Action dated Jul. 9, 2012 issued in U.S. Appl. No. 12/481,503.

Chinese Office Action, dated Jul. 19, 2011, issued in 201130081716.6.

Taiwan Office Action, dated Nov. 28, 2011, issued in 100301923.

Korean Office Action, dated Apr. 20, 2012, issued in 2011-0012881.

\* cited by examiner

METHOD AND APPARATUS FOR ELECTROPLATING

CROSS-REFERENCE TO RELATED APPLICATIONS

This application is a continuation of U.S. patent application Ser. No. 12/481,503, filed Jun. 9, 2009, and naming Steven Mayer et al. as inventors, which is in turn a continuation-in part of U.S. patent application Ser. No. 12/291,356, filed Nov. 7, 2008, now issued as U.S. Pat. No. 8,308,931, naming Jonathan Reid et al. as inventors, both of which are herein incorporated by reference in its entirety and for all purposes. This application is also a continuation-in-part application of U.S. patent application Ser. No. 11/213,190, filed Aug. 26, 2005, now issued as U.S. Pat. No. 7,686,935, naming S. Mayer et al. as inventors, which is a continuation-in-part application of U.S. patent application Ser. No. 10/274,755, filed Oct. 21, 2002, by Contolini et al., titled "Dynamically Variable Field Shaping Element", now issued as U.S. Pat. No. 7,070,686, which in turn is a continuation-in-part application of U.S. patent application Ser. No. 09/542,890 filed Apr. 4, 2000, by Contolini et al., now issued U.S. Pat. No. 6,514,393, and which is also a continuation-in-part application of U.S. patent application Ser. No. 10/116,077 filed Apr. 4, 2002, by Mayer et al., titled "Electrochemical Treatment Of Integrated Circuit Substrates Using Concentric Anodes And Variable Field Shaping Elements", now issued U.S. Pat. No. 6,755, 954, which in turn is a continuation-in-part application of U.S. patent application Ser. No. 09/537,467 filed Mar. 27, 2000, by Mayer et al., now issued U.S. Pat. No. 6,402,923, each of which is incorporated herein by reference in its entirety and for all purposes. U.S. patent application Ser. No. 11/213,190 is also a continuation-in-part application of U.S. patent application Ser. No. 10/916,374, filed Aug. 10, 2004, now issued as U.S. Pat. No. 6,919,010, which claims the benefit of U.S. provisional Application Ser. No. 60/580, 572, filed Jun. 16, 2004, and which is also a continuation-in-part application of U.S. patent application Ser. No. 10/154, 082, filed May 22, 2002, now U.S. Pat. No. 6,773,571, which claims the benefit of U.S. provisional Application Ser. No. 60/302,111, filed Jun. 28, 2001, each of which is incorporated herein by reference in its entirety and for all purposes.

BACKGROUND OF THE INVENTION

The transition from aluminum to copper in integrated circuit (IC) fabrication required a change in process "architecture" (to damascene and dual-damascene) as well as a whole new set of process technologies. One process step used in producing copper damascene circuits is the formation of a "seed-" or "strike-" layer, which is then used as a base layer onto which copper is electroplated (electrofill). The seed layer carries the electrical plating current from the edge region of the wafer (where electrical contact is made) to all trench and via structures located across the wafer surface. The seed film is typically a thin conductive copper layer. It is separated from the insulating silicon dioxide or other dielectric by a barrier layer. The use of thin seed layers (which may also act simultaneously as copper diffusion barrier layers) which are either alloys of copper or other metals, such as ruthenium or tantalum, has also been investigated. More detail on such seed layers can be found in U.S. patent application Ser. No. 12/359,997, entitled Diffusion Barrier Layers, filed Jan. 26, 2009, which is incorporated herein by reference. The seed layer deposition process should yield a layer which has good overall adhesion, excellent step coverage (more particularly, conformal/continuous amounts of metal deposited onto the side-walls of an embedded structure), and minimal closure or "necking" of the top of the embedded feature.

Market trends of increasingly smaller features and alternative seeding processes drive the need for a capability to plate with a high degree of uniformity on increasingly thin seeded wafers. In the future, it is anticipated that the seed film may simply be composed of a plateable barrier film, such as ruthenium, a bilayer of a very thin barrier and copper (deposited, for example, by an atomic layer deposition (ALD) or similar process), or an alloy of various metals. These thin films, some having inherently large specific resistivities, present the engineer with an extreme terminal effect situation. For example, when driving a 3 amp total current uniformly into a 30 ohm per square ruthenium seed layer (a likely value for a 30-50 Å film), the resultant center to edge voltage drop in the metal will be over 2 volts. To effectively plate a large surface area, the plating tooling makes electrical contact to the conductive seed only in the edge region of the wafer substrate. There is no direct contact made to the central region of the substrate. Hence, for highly resistive seed layers, the potential at the edge of the layer is significantly greater than at the central region of the layer. Without appropriate means of resistance and voltage compensation, this large edge-to-center voltage drop could lead to an extremely non-uniform plating thickness distribution, primarily characterized by thicker plating at the wafer edge. For comparison, the thermodynamic limit of the voltage drop for electrolyte solvent (water) is only about 1.4V.

FIG. 1 is a schematic of an approximated equivalent electrical circuit for the problem. It is simplified to one dimension for clarity. The continuous resistance in the seed layer is represented by a set of finite (in this case four) parallel circuit elements. The in-film resistor elements $R_f$, represent the differential resistance from an outer radial point to a more central radial point on the wafer. The total current supplied at the edge, $I_t$, is distributed to the various surface elements, $I_1$, $I_2$, etc., scaled by the total path resistances with respect to all the other resistances. The circuits more centrally located have a larger total resistance because of the cumulative/additive resistance of the $R_f$ for those paths. Mathematically, the fractional current Fi through any one of the surface element paths is $$F_i = \frac{I_i}{I_t} = \frac{Z_T}{Z_i} = \frac{\frac{1}{(iR_f + R_{ct,i} + Zw_i + R_{el,i})}}{\sum_{1}^{n} \frac{1}{iR_f + R_{ct,i} + Zw_i + R_{el,i}}} \quad (1)$$

where n is the total number of parallel paths that the circuit is divided into, i (sometime used as a subscript) refers to the $i^{th}$ parallel current path (from the edge terminal), t refers to the total circuit, I is current, $R_f$ is the resistance in the metal film between each element (constructed, for simplicity, to be the same between each adjacent element), $R_{ct}$ is the local charge transfer resistance, $Z_w$ is the local diffusion (or Warberg) impedance and $R_{el}$ is the electrolyte resistance. With this, $I_i$ is the current to through the $i^{th}$ surface element pathway, and $I_t$ is the total current to the wafer. The charge transfer resistance at each interfacial location is represented by a set of resistors $R_{ct}$ in parallel with the double layer capacitance $C_{dl}$, but for the steady state case does not effect the current distribution. The diffusion resistances, represented by the Warberg impedance (symbol $Z_w$) and the electrolyte resistance ($R_{el}$) are shown in a set of parallel circuit paths, all in series with the particular surface element circuit, give one of several parallel paths for the current to traverse to the anode. In practice, $R_{ct}$ and $Z_w$ are quite non-linear (depending on current, time, concentrations, etc.), but this fact does not diminish the utility of this model in comparing how the current art and this disclosure differ in accomplishing uniform current distribution. To achieve a substantially uniform current distribution, the fractional current should be the same, irrespective of the element position (i). When all terms other than the film resistance term, $R_f$, are relatively small, the current to the $i^{th}$ element is $$F = \frac{\frac{1}{i}}{\sum_{1}^{n} \frac{1}{i}} \quad (2)$$

Equation 2 has a strong i (location) dependence and results when no significant current distribution compensating effects are active. In the other extreme, when $R_{ct}$, $Z_w$, $R_{el}$ or the sum of these terms are greater than $R_f$, the fractional current approaches a uniform distribution; the limit of equation 1 as these parameters become large is F=1/n, independent of location i.

Classical means of improving plating non-uniformity draw upon (1) increase $R_{ct}$ through the use of copper complexing agents or charge transfer inhibitors (e.g., plating suppressors and levelers, with the goal of creating a large normal-to-the-surface voltage drop, making $R_f$ small with respect to $R_{ct}$), (2) very high ionic electrolyte resistances (yielding a similar effect through $R_{el}$), (3) creating a significant diffusion resistance ($Z_w$), or (4) variations of a plating current recipe to minimize voltage drop, or control of mass transfer rate to limit current density in areas of high interfacial voltage drop (see e.g., U.S. Pat. Nos. 6,110,344, 6,074,544, and 6,162,344, each of which is incorporated herein by reference).

These approaches have significant limitations related to the physical properties of the materials and the processes. Typical surface polarization derived by organic additives cannot create polarization in excess of about 0.5V (which is a relatively small value in comparison to, for example, the 2V seed layer voltage drop that must be compensated as noted above). Also, because the conductivity of a plating bath is tied to its ionic concentration and pH, decreasing the conductivity directly and negatively impacts the rate of plating and morphology of the plated material.

What is needed therefore is an improved technique for uniform electroplating onto thin-metal seeded wafers, particularly wafers with large diameters (e.g. 300 mm).

SUMMARY

These needs are addressed, in one aspect, by providing an electroplating apparatus and a method for uniform electroplating that make use of an ionically resistive element having electrolyte-permeable pores or holes, where the element resides in close proximity of the wafer substrate. The ionically resistive ionically permeable element described herein substantially improves plating uniformity on thin resistive seed layers. It is particularly useful when employed in combination with an auxiliary cathode configured to divert or remove a portion of current from the anode that would otherwise pass to the edge region of the wafer. In certain embodiments, the auxiliary cathode resides between the ionically resistive ionically permeable element and an anode in the electroplating apparatus. In certain embodiments, the auxiliary cathode is located in this position as a virtual cathode. The ionically resistive ionically permeable element described herein presents a uniform current density in the proximity of the wafer cathode and therefore serves as a virtual anode. Accordingly, the ionically resistive ionically permeable element will be also referred to as a high-resistance virtual anode (HRVA)

In certain embodiments, the HRVA is located in close proximity to the wafer. In certain embodiments, the HRVA contains a plurality of through-holes that are isolated from each other and do not form interconnecting channels within the body of HRVA. Such through-holes will be referred to as 1-D through-holes because they extend in one dimension, typically, but not necessarily, normal to the plated surface of the wafer. These through-holes are distinct from three-dimensional porous networks, where the channels extend in three dimensions and form interconnecting pore structures. An example of a HRVA is a disk made of an ionically resistive material, such as polycarbonate, polyethylene, polypropylene, polyvinylidene diflouride (PVDF), polytetrafluoroethylene, polysulphone and the like, having between about 6,000-12,000 1-D through-holes. In certain embodiments, the HRVA is a porous structure in which at least some of the pores are interconnected and therefore allow some two- or three-dimensional movement of electrolyte therein. The disk, in many embodiments, is substantially coextensive with the wafer (e.g., has a diameter of about 300 mm when used with a 300 mm wafer) and resides in close proximity of the wafer, e.g., just below the wafer in a wafer-facing-down electroplating apparatus. In some embodiments, the disk is relatively thin, for example between about 5 and 50 mm thick. The plating electrolyte contained within the pores of the HRVA allows ionic current to pass though the disk, but at a significant voltage drop compared to the system as a whole. For example, the voltage drop in the HRVA may be greater than about 50%, for example, between about 55 and 95%, of the total voltage drop between the counter electrode (anode) and the wafer peripheral edge. In certain embodiments, the plated surface of the wafer resides within about 10 mm, and in some embodiments, within about 5 mm, of the closest HRVA surface.

In an embodiment of an apparatus for electroplating metal onto a substrate, the apparatus includes a plating chamber configured to contain an electrolyte and an anode while electroplating metal onto the substrate A substrate holder is configured to hold the substrate such that a plating face of the substrate is positioned at a defined distance from the anode during electroplating, the substrate holder having one or more electrical power contacts arranged to contact an edge of the substrate and provide electrical current to the substrate during electroplating. An ionically resistive ionically permeable element is positioned between the substrate and the anode during electroplating, the ionically resistive ionically permeable element having a flat surface that is substantially parallel to and separated from a plating face of the substrate by a gap of about 5 millimeters or less during electroplating. In some embodiments, the anode may be located in a current-confining and directing anode-chamber that allows current to substantially only exit the chamber though the pores of the ionically resistive ionically permeable element, and an auxiliary cathode, located between the anode and the ionically resistive ionically permeable element, and peripherally oriented to shape the current distribution from the anode while the auxiliary cathode is supplied with current during electroplating.

In another embodiment of the invention, a metal layer is plated onto a substrate. Plating the metal layer includes: (a) holding a substrate, having a conductive seed and/or barrier layer disposed on its surface, in a substrate holder of an electroplating apparatus; (b) immersing a working surface of the substrate in an electrolyte solution and proximate an ionically resistive ionically permeable element positioned between the working surface and the anode contained in the plating chamber, and in some embodiments, the anode may be located in a current-confining and directing anode-chamber that allows current to substantially only exit the chamber though the pores of the ionically resistive ionically permeable element, the ionically resistive ionically permeable element having a flat surface that is parallel to and separated from a working face of the substrate by a gap of about 5 millimeters or less; (c) supplying current to the substrate to plate the metal layer onto the seed and/or barrier layer; and (d) supplying current to an auxiliary cathode located between the anode and the ionically resistive ionically permeable element to shape the current distribution from the anode.

These and other features and advantages of the present invention will be described in more detail below with reference to the associated drawings.

DETAILED DESCRIPTION

Figure 1A:
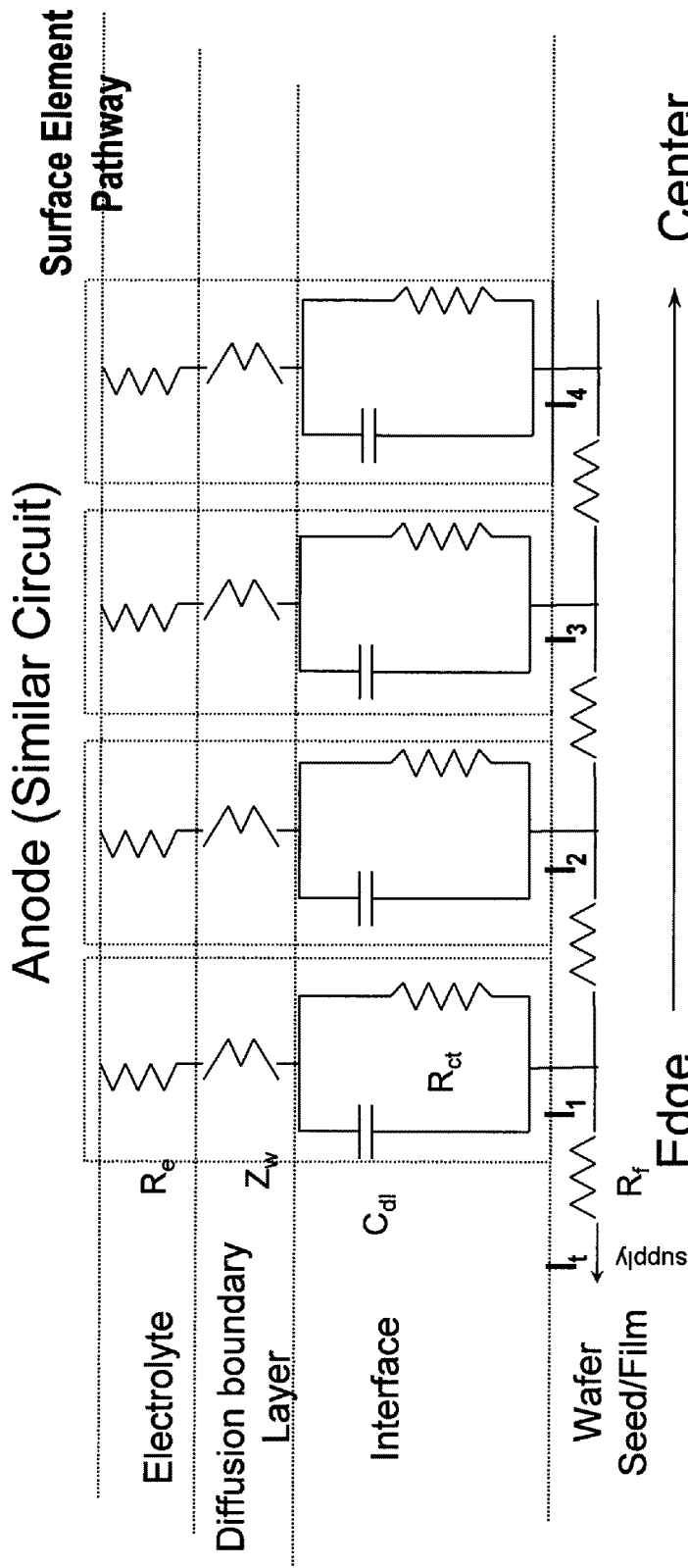
FIG. 1A is a schematic diagram depicting an equivalent circuit for electroplating on a thin seed layer.
Figure 1B:
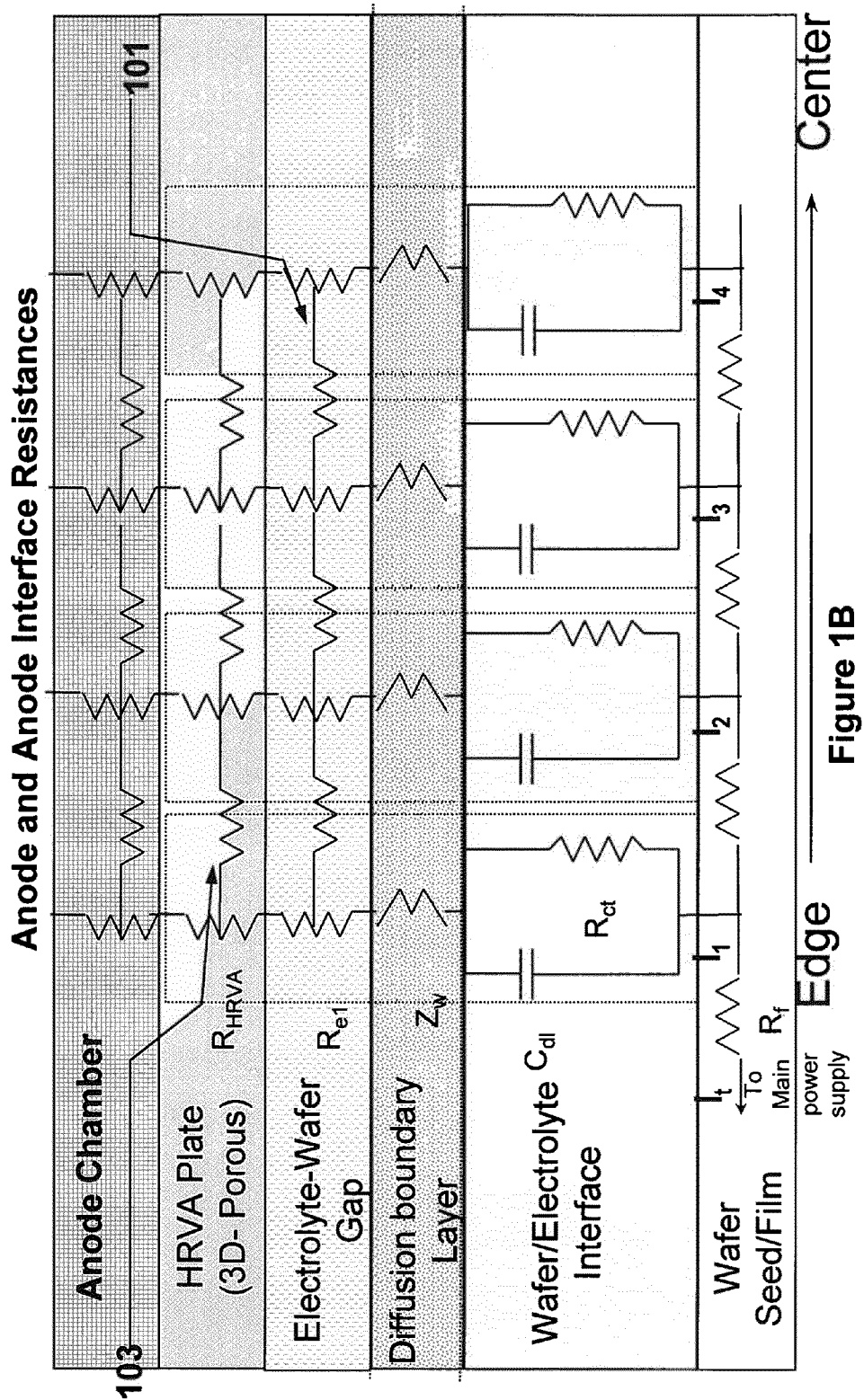
FIG. 1B is a schematic diagram depicting an equivalent circuit for electroplating on a thin seed layer in a presence of an ionically resistive ionically permeable element having 3-D porous network.
Figure 1C:
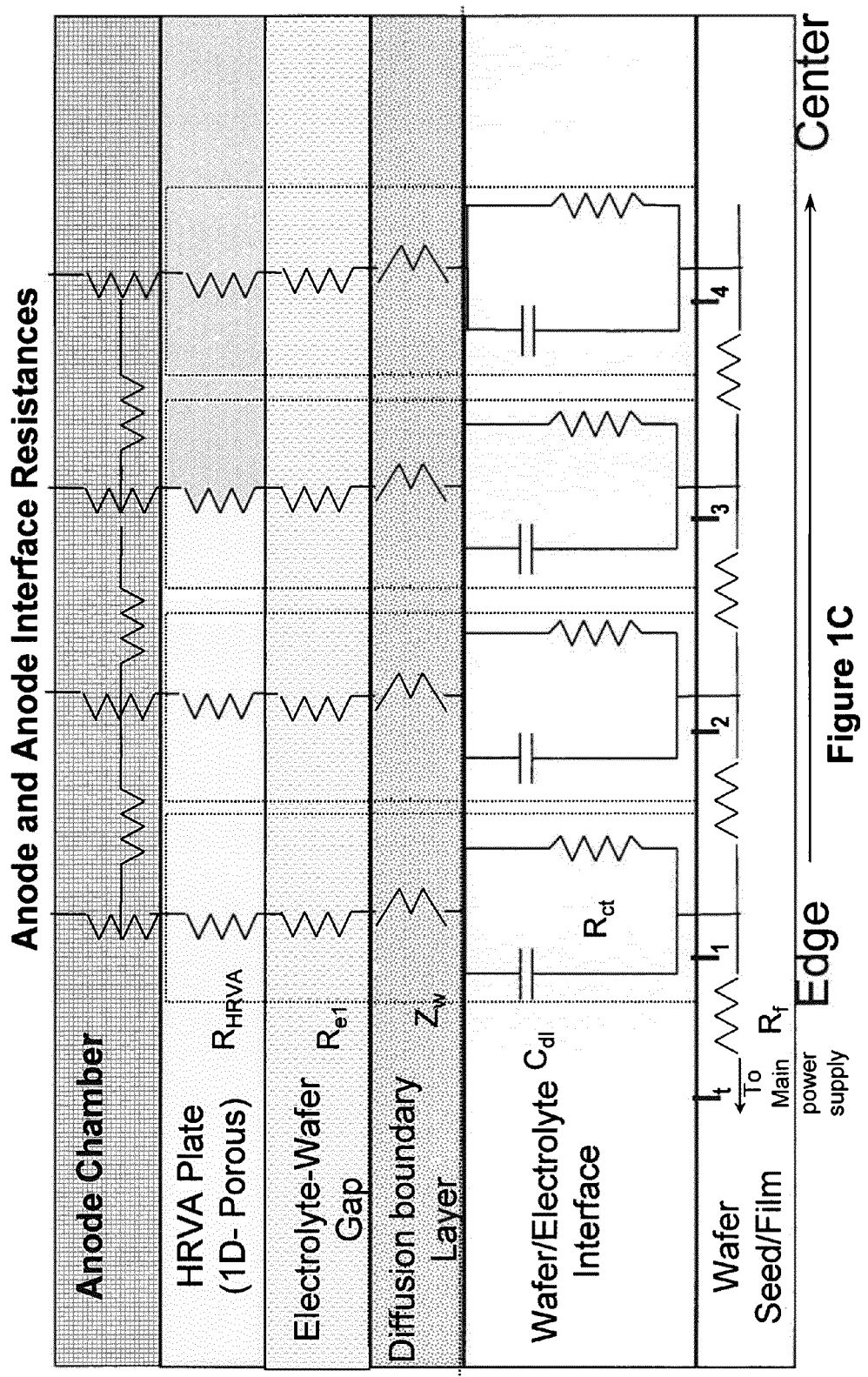
FIG. 1C is a schematic diagram depicting an equivalent circuit for electroplating on a thin seed layer in a presence of an ionically resistive ionically permeable element having 1-D porous network

Advanced technologies call for the electroplating of metals onto wafers with sheet resistances of 10 ohm per square and higher (even 20 ohms per square or 40 ohms per square or higher). This requires ever more aggressive techniques (i.e., techniques other than only the use of a HRVA alone or a thief electrode alone) to compensate for the terminal effect. During plating, the thickness of metal and the sheet resistance can drop several orders of magnitude in a short time, and so methods and apparatus capable of plating uniformly on the wafer throughout a process where there may be a rapidly initially varying and later a relatively constant sheet resistance are required. Embodiments of the present invention address the challenges presented by such high resistance seed layers, the rapid dynamic variance in the seed electrical parameters, and the extreme terminal effect they present.

Embodiments of the present invention pertain to methods and apparatuses for electroplating a substantially uniform layer of metal onto a work piece having a seed layer thereon. In certain embodiments, a plating cell includes both a porous HRVA in close proximity to a work piece and a thief electrode (referred to also as an "auxiliary" cathode). The "thief" electrode is located between the HRVA and an anode. In some cases, multiple thief electrodes may be used. A thief cathode can remove or divert a portion of ionic current emanating from the anode which is directed to the outer periphery, including the very edge of the wafer in the absence of the thief cathode, thereby modifying the current and enabling a vastly improved uniformity of current density experienced by the wafer. In some cases, however, it may be desirable to use embodiments of the invention to create a non-uniform current density that is experienced by the wafer. For example, it may be desirable to create a non-uniform current density, resulting in non-uniform metal plating, during overburden deposition to aid in chemical mechanical polishing (CMP), wet chemical etching, electropolishing, or electromechanical polishing.

Significantly, the use of the auxiliary cathode in combination with a porous HRVA positioned in close proximity of the wafer provides advantages well in excess of the advantages provided individually by these elements, and the combination of the two work in a synergistic manner. The auxiliary cathode is positioned between the plating cell's anode and HRVA. In the case of a vertically oriented cell, the auxiliary cathode is located below the HRVA. In certain embodiments, the auxiliary cathode is generally ring or annularly shaped to provide significant impact on the current density distribution at the peripheral region of the work piece. The advantages of this cathode may be accentuated by a small HRVA-to-wafer spacing, and/or by restricting the flow of current in the body of the HRVA.

One of the advantages of employing an auxiliary cathode for modulating the current directed at a wafer (over, for example, a moving mechanical shield or iris) is that the level of current applied to the auxiliary cathode can be rapidly and dynamically controlled during the plating process (e.g., times shorter than a few seconds) to account for rapidly changing metal sheet resistance as the metal is deposited. This aids in keeping the plating non-uniformity to a minimum during different times in the plating process. For example, the level of current applied to the auxiliary cathode can start at high level when the layer is thin, and then can be gradually or incrementally reduced during plating (e.g., over a period of a few seconds) as the thickness of the plated layer increases and the severity of the terminal effect subsides.

A HRVA and/or a second auxiliary cathode, positioned near the work piece, can influence the plating surface of the work piece and reshape the current distribution on a wafer by changing the voltage and current distribution only in a region in close proximity to the face of the work piece. These elements do not significantly impact the current distribution within the electrolyte or at the anode at a significant distance from the work piece surface, such as below the HRVA. Thus, these measures (using the HRVA and/or second auxiliary cathode located near the wafer or HRVA as described herein) have little or no impact on the current distribution closer to the anode which resides below the HRVA. In many cases, the ionic current distribution remains nearly constant in the region between the anode and the HRVA.

The HRVA alone generally will improve the long range radial current distribution over configurations without a HRVA (from less uniform to more uniform). However, without a specific radial-pore-pattern limited to the application over a thickness/sheet resistance range or a mechanically activated dynamic change in shielding, the radial current distribution generally tends to be less than perfectly uniform, generally center thin. A secondary auxiliary cathode, positioned above the HRVA and peripheral to the wafer edge, can dynamically influence the edge current distribution (typically limited to a region within about 1-3 cm from the edge), but not change the central plating region's current distribution. For some applications, particularly situations where the sheet resistance is exceedingly large, using a HRVA and/or second auxiliary cathode as described herein may be insufficient to fully overcome the terminal effect.

It may be necessary to modify the current distribution inside the electrolyte at positions well removed from the work piece, i.e., at a position relatively closer to the anode, to adequately address the terminal effect when very high resistance seed or seed/barrier combination layers are used. In certain embodiments described herein, this is accomplished by positioning an auxiliary cathode at a location below the HRVA and between the work piece and the anode. The auxiliary cathode is shaped and oriented to modify the current density distribution within the electrolyte in a plane parallel to the wafer, below the HRVA, and located some distance from the work piece in a manner that reduces the current density and current vector (flow direction) in regions of the plane below and corresponding to the edge regions of the work piece. This is similar to the on-wafer effect of a physical iris or shield placed below a work piece in a plating chamber. For this reason, the auxiliary electrodes of embodiments of this invention are sometimes referred to as "electronic irises", or an "EIRIS", because an electronic auxiliary electrode is used to accomplish a result similar to that of a physical iris placed in the current path between the wafer and the anode. In the case an EIRIS, however, the current vector trajectory is shifted radially outwards, rather than being blocked at larger radii and being forced and squeezed inwards with a physical iris.

To elaborate, one difference between an EIRIS and a physical iris or shield is that all the current from the anode passes through the physical iris, as it "squeezes through" the iris or shielding restriction. Current is largely or completely blocked by the iris shield and is re-routed from the edge regions radially inwards before passing upwards. As a result, the central current density in the region of the shield opening is generally increased. In the case of the EIRIS, not all the current emanating from the anode arrives at the wafer, as some of the edge current is generally diverted radially outwards towards the auxiliary electrode. Above the auxiliary cathode the magnitude of the current density vector directed at the wafer tends to be reduced because of the diversion, but the current density in the central region of an EIRIS-equipped electroplating apparatus above the EIRIS is only slightly decreased or perhaps unaltered vs. the non-EIRIS case.

The region where the auxiliary cathode acts is generally parallel to the substrate surface and separated therefrom. Generally, it is desirable to have the auxiliary cathode located relatively close to the lower surface of the HRVA so that the current does not have the space in which to redistribute to a more non-uniform profile before reaching the HRVA surface. The distance, d, between the lower surface of the HRVA and the auxiliary cathode should generally be approximately equal to or less than the radius, r, of wafer onto which metal is being plated (i.e., $d \sim \leq r$). The auxiliary cathode should also be significantly above the plane of the anode so the current from the anode has space to change directions without unduly large auxiliary cathode voltages or currents.

Generally, the distance of the auxiliary cathode in the anode chamber and below the wafer and HRVA (when the system has a HRVA) should be kept to less than about 50% of the wafer diameter. For example, for a 300 mm wafer, the auxiliary cathode might be between about 0.75 to 6.5 inches below the wafer and between about 0.25 and 6 inches below a HRVA. In contrast, the location of the anode relative to the wafer, HRVA (when employed), and auxiliary cathode is a compromise between functional performance as well as engineering waste. Typically, the anode should generally be in the anode chamber and below all three of these elements. But while the electroplating apparatus might have the anode located far below the wafer, HRVA, and auxiliary electrode, for example, 40 inches below the wafer, such an electroplating apparatus, while it could be made to function, would require quite a bit of excess power.

As was already noted, the auxiliary cathode should be relatively close to the wafer or bottom surface of the HRVA. As way of a further example, if the auxiliary cathode was located 39 inches below the wafer with an anode 40 inches below the wafer (i.e., reasonably close to the plane of the anode and far from the bottom of the HRVA), most of the current from the anode would go to the EIRIS, but that which left the lower region of the electroplating apparatus anode chamber would have a great distance to travel before reaching the wafer. Over such a distance, the current would tend to equilibrate back to a different current distribution by the time it reached the HRVA and wafer, so the uniformity at the wafer would be largely unaffected by the existence of the EIRIS. Alternatively, if the anode were 0.75 inches from the wafer, 0.25 inches below the HRVA, and substantially parallel to or even above the EIRIS, the electroplating apparatus also would not work as well as when the anode were substantially below the EIRIS as described above, because the EIRIS would not be as effective in removing current from the more central regions of the cell. Therefore, in some embodiments, the distance of the physical anodes (or virtual anode mouth) surface closest to the wafer should be at last about $\frac{1}{10}$ the wafer diameter below the plane of the EIRIS electrode (or virtual EIRIS cavity mouth) closest to the wafer. For example, if the plane of the EIRIS electrodes closest point to a 300 mm wafer is 50 mm below the wafer and 25 mm below the HRVA, then the anode should be at least about 30 mm below that plane, or a total of 80 mm (30+50=80) below the wafer.

Structure of the Resistive Element

In certain embodiments, the ionically resistive ionically permeable element provided herein is a microporous plate or disk having a continuous three-dimensional network of pores (e.g., plates made of sintered particles of ceramics or glass). The porous plates having three-dimensional pore networks have intertwining pores through which ionic current can travel both vertically up through the disk in the general direction of the anode to wafer, as well as laterally (e.g., from the center to the edge of the disk). Examples of suitable designs for such plates are presented in U.S. patent application Ser. No. 11/040,359 filed Jan. 20, 2005, which is herein incorporated by reference.

In other embodiments, through-holes are provided in the resistive element to form channels that do not substantially communicate with one another within the body of the element, thereby minimizing lateral movement of ionic current in the element. Current flows in a manner that is one-dimensional, substantially in the vector direction that is normal to the closest plated surface near the resistive element.

The ionically resistive ionically permeable element having 1-D through-holes (also referred to as 1-D porous HRVA) is typically a disk (other shapes may also be used) made of an ionically resistive material having a plurality of holes drilled (or otherwise made) through it. The holes do not form communicating channels within the body of the disk and typically extend through the disk in a direction that is substantially normal to the surface of the wafer. A variety of ionically resistive materials can be used for the disk body, including but not limited to polycarbonate, polyethylene, polypropylene, polyvinylidene diflouride (PVDF), polytetrafluoroethylene, polysulphone and the like. Preferably, the disk materials are resistant to degradation in acidic electrolyte environment, are relatively hard, and are easy to process by machining.

In some cases, the HRVA is an ionically resistive element having a large number of isolated and unconnected ionically permeable through-holes (e.g., a resistive disk having multiple perforations or pores allowing for passage of ions) in close proximity to the work piece, thereby dominating or "swamping" the overall system's resistance. When sufficiently resistive relative to the wafer sheet resistance, the element can be made to approximate a uniform distribution current source. By keeping the work piece close to the resistive element surface, the ionic resistance from the top of the element to the surface is much less than the ionic path resistance from the top of the element to the work piece edge, substantially compensating for the sheet resistance in the thin metal film and directing a significant amount of current over the center of the work piece. Some benefits and details associated with using ionically resistive ionically permeable element in close proximity of the substrate are discussed in detail in the U.S. patent application Ser. No. 11/040,359, previously incorporated by reference.

Regardless of whether the disk permits one or more dimensional current flow, it is preferably co-extensive with the wafer, and, therefore, has a diameter that is typically close to the diameter of the wafer that is being plated. Thus, for example, the disk diameter can range between about 150 mm and 450 mm, with about 200 mm disk being used for a 200 mm wafer, about 300 mm disk for a 300 mm wafer, and about 450 mm disk for a 450 mm wafer, and so forth. In those instances where the wafer has a generally circular shape but has irregularities at the edge, e.g., notches or flat regions where wafer is cut to a chord, a disk-shaped HRVA can still be used, but other compensating adjustments can be made to the system, as described in U.S. application Ser. No. 12/291,356 filed Nov. 7, 2008, naming Reid et al. as inventors, previously incorporated by reference. In some embodiments, the HRVA has a diameter that is greater than the diameter of the wafer to be plated (e.g., greater than 200 mm or 300 mm), and has an outer edge portion that is hole-free (in the case of a one-dimensional HRVA). Such edge portion can be used to create a small gap about the periphery of the wafer (a peripheral gap between the HRVA edge portion and either the wafer edge or the bottom of wafer-holding cup), and to assist in mounting the HRVA within the chamber, e.g., to an anode chamber wall. In some embodiments the size of the hole-free HRVA edge is between about 5 mm and about 50 mm from the outer edge of the HRVA to the edge of the portion of the HRVA that has holes.

Figure 2A:
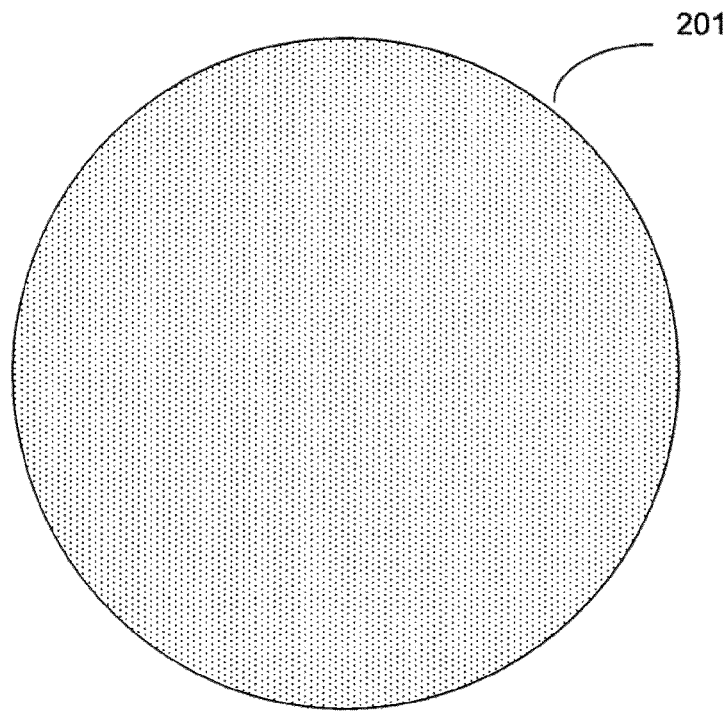
FIG. 2A is a schematic representation of a top view of an ionically resistive element having a plurality of 1-D through-holes, in accordance with embodiments presented herein.
Figure 2B:
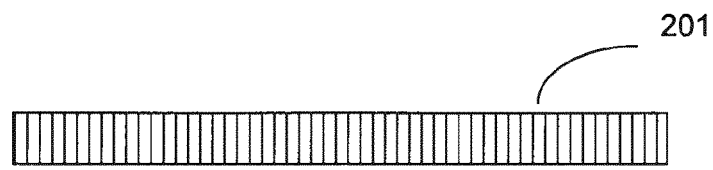
FIG. 2B is a schematic representation of a cross-sectional view of the ionically resistive element having a plurality of 1-D through-holes, in accordance with embodiments presented herein.

In the case of a one-dimensional HRVA, the number of through-holes made in the disk should be relatively large, but the diameter of each hole should be quite small. Generally, the diameter of each hole generally should be less than about ¼ the HRVA to wafer gap. In one embodiment the number of holes ranges between about 6,000 and about 12,000, each hole (or at least 95% of holes) having a diameter (or other principal dimension) of less than about 1.25 mm. A schematic top view of HRVA plate 201 is shown in FIG. 2A, illustrating a top HRVA surface having a large number of small-diameter openings, shown as black dots. FIG. 2B illustrates a cross-sectional view of the HRVA disk 201, schematically illustrating non-communicating through-holes. In this embodiment the through-holes are substantially perpendicular to the top and bottom surfaces of the HRVA disk. The thickness of the HRVA disk ranges in some embodiments between about 5 mm and about 50 mm, e.g., between about 10 mm and about 25 mm.

While HRVA shown in FIG. 2A has a uniform distribution of through-holes, in other embodiments it is advantageous to use a HRVA having regions with non-uniform distribution of holes, or with holes that are blocked such that the wafer experiences non-uniform hole distribution. Such a distribution permanently directs more current to the center, so a high resistance film is more uniformly plated than if a uniform hole distribution is used. A very thick film (i.e., with a low sheet resistance), however, will tend to plate more non-uniformly if a non-uniform hole distribution is used. The blocked or missing holes may be non-uniform in the radial, azimuthal, or both directions. In some embodiments, the ionically resistive ionically permeable element is positioned substantially parallel to the wafer and anode surface, and the one-dimensional through-holes are oriented parallel to the direction between the wafer and anode surface. In other embodiments, at least some of the holes have their relative angle modified to change the hole length relative to the element thickness, and thereby modify the local contribution of the holes to the resistance.

It is important to note here that a HRVA is distinct from so-called diffuser plates, whose main function is to distribute flow of electrolyte, rather than to provide significant electrical resistance. As long as 1) the flow is relatively uniform, 2) the gap sufficiently large between the wafer holder and diffuser plane, and 3) the spacing between the wafer and anode is sufficiently large, the relative gap between a low electrical resistance diffuser and the wafer will typically only have a minor impact on the current distribution when plating a high sheet resistance wafer. Also, a diffuser in combination with an auxiliary electrode below the diffuser is not as effective in achieving uniform current, particularly on high resistance wafers, as a HRVA/auxiliary electrode combination (as described herein, and compared in FIG. 12, curves 1203 vs.

1204), because the added voltage drop and separation above and below the diffuser does not exist. In contrast, a HRVA significantly increases resistance of the plating system, as is needed for improving plating uniformity.

Generally, for 300 mm systems, porous resistive elements (i.e., a HRVA) in combination with appropriate electrolytes which increase system resistance by at least 0.45 ohm, or at least 0.6 ohm, are preferred. The porous resistive element should increase the system resistance by at least about 300, or preferably at least about 420 ohm cm$^2$ for each cm$^2$ of projected porous elements area. The high resistance of the provided element is achieved by providing a low but continuously connected porosity. It is not just the porous resistive element's porosity that is important, but the combined HRVA characteristic of a relatively thin layer that has unusually low porosity, so as to achieve a compact region of very high resistance that can be positioned in close proximity to the wafer surface. In certain embodiments, the thickness of the HRVA is less than about 15% of the wafer diameter. In contrast, if a non-one-dimensional, lower porosity, thicker, but still higher resistance element is used, the total system resistance could be made to be the same, but the current diverting characteristics would not be the same. Current within a thick, relatively low porous element tends to enter the central region and flow radially outwards as it flows upwards. Very high resistance plates tend to have the current flow only upwards toward the wafer.

In the case of a one-dimensional HRVA, current is prevented from flowing radially by providing an extremely large number of small through-holes, each having very small principal dimension (or diameter for circular holes). For example, disks having between about 6,000-12,000 perforations, with each perforation having a diameter of less than about 5 mm, e.g., less than about 4 mm, less than about 3 mm, or less than about 1 mm are suitable resistive elements. The porosity value for suitable disks ranges typically from 1 to 5%. Such disks increase the resistance of the plating system by about 0.3 to 1.2 ohm or more, depending on the design and electrolyte conductivity. In contrast, diffuser plates typically have openings that constitute a much larger net porosity (in the range of from 25 to 80 percent open void fraction), no more than is required to achieve a substantially uniform electrolyte flow though a significant viscous flow resistance, and generally have a much smaller, often insignificant overall contribution to resistance of the plating system.

In one specific example, the ionically resistive ionically permeable element (HRVA) is a disk having about 9,000 unique 1 dimensional individual perforations, each having a diameter of about 0.6 mm. The disk in this example has a diameter of about 300 mm (substantially coextensive with a 300 mm wafer), a thickness of about 13 mm, and is typically placed from about 2 to 5 mm from the wafer surface.

While a HRVA (unlike a diffuser plate) should always have substantial resistivity, in some embodiments the HRVA is configured such that it does not increase the system total resistance by more than about 5 ohms. While a larger system total resistance may be used, this limitation is because excessive resistance will require increased power to be used, leading to undesirable heating of the electroplating system. Also, because of some practical limitations of manufacturability (i.e., creating a large number or exceedingly small diameter holes), performance (fewer holes leading to individual-hole current "imaging"), and loss of general process utility (e.g., inability to plate thicker films without wasted power, heat and bath degradation), about 5 ohms is a practical HRVA limitation.

Another important parameter of a one-dimensional resistive element is the ratio of a through-hole diameter (or other principal dimension) to the distance of the element from the wafer. It was discovered experimentally and subsequently verified by computer modeling that this ratio should be approximately 1 or less (e.g., less than about 0.8, or less than about 0.25). In some embodiments, this ratio is about 0.1 for providing the best plating uniformity performance. In other words, the diameter of the through-hole should be equal to or smaller than the distance from the resistive HRVA element to the wafer. In contrast, if the through-hole diameter is larger than the wafer-to-HRVA distance, the through-hole may leave its individual current image or "footprint" on the plated layer above it, thereby leading to small scale non-uniformity in the plating. The hole diameter values recited above refer to the diameter of the through-hole opening measured on the HRVA face that is proximate to the wafer. In many embodiments, the through-hole diameter on both proximate and distal faces of HRVA is the same, but it is understood that holes can also be tapered.

The distribution of current at the wafer (and, consequently, plating uniformity) can depend on a number of factors, such as the plating gap (HRVA plate to wafer distance), electrolyte flow rate, anode chamber design, plating solution properties, and uniformity of hole distribution on the HRVA. Regarding hole distribution, the holes in a HRVA plate may be designed to be of the same size and are distributed substantially uniformly. However, in some cases, such an arrangement can lead to a center spike or dip in the plated film thickness, or a corrugated (wavy) pattern. Specifically, use of a HRVA having uniform distribution of holes in the center has resulted in center spikes of about 200-300 Å for 1 µm plated layer.

In one embodiment, a non-uniform distribution of 1-D pores/holes in the central region of the HRVA is employed to prevent the center spikes. The central region of HRVA is defined by a circular region at the HRVA center, typically within about 1 inch radius from the center of HRVA disk, or within about 15% of the wafer radius. The non-uniform distribution of through-holes effective for spike reduction can have a variety of arrangements achieved by shifting holes, adding new holes, and/or blocking holes in an otherwise uniform pattern. Various non-uniform center hole patterns may be useful for avoiding plating non-uniformity and are described in U.S. patent application Ser. No. 12/291,356 filed Nov. 7, 2008 and previously incorporated by reference.

Virtual Electrode

Two types of current source (or sink) electrodes should be recognized in a plating apparatus as described herein: a virtual electrode and a physical electrode. Both types of electrodes provide either current sources (anodes) or current sinks (cathodes).

Physical electrodes are commonly known as electrochemical interfaces, typically composed of a conductive material such as a metal (e.g. copper) that are solid (or in some circumstances a liquid when using a conductive liquids such as mercury) physical structures where an electrochemical reaction takes place at the electrolyte interface. An example of a physical electrode is a piece of copper where copper electrodeposition or oxidation takes place. These physical conductive anodes or cathodes, disposed within an electrolyte of an electroplating chamber, can have various dimensions and can be located as desired anywhere within an electroplating chamber, either inside or outside an anode chamber as described herein, above, below or to the side of a plating substrate or HRVA plate depending on the type of electrode and its desired function. While the physical electrode has a finite size (depth), when the electrode is non-porous (e.g. as a solid piece of metal), the influence of the physical electrodes on the reaction current distribution is generally limited primarily to the surface contour of the electrode exposed to the electrolyte within the chamber.

A virtual electrode has an associated physical electrode that is located at a position removed from that of the virtual electrode. In other words, the positions of the virtual electrode and its associated physical electrode are separated by some distance. However, the virtual electrode is in ionically conductive communication with its associated physical electrode. In addition to its physical electrode, a virtual electrode is defined by an insulating or highly resistive cavity structure which constrains the current and current distribution associated with the physical electrode. Such structure is typically in contact with the electroplating solution. Without the insulating or highly ionically resistive structure, the current distribution from the physical electrode could be significantly more non-uniform at the location of the virtual electrode. A typical insulating structure is a focusing tube or focusing cavity that surrounds the physical electrode in all directions except for an opening or mouth to a larger region of the plating chamber (e.g., an opening to the main part of the chamber). The effective location of the virtual electrode in such designs is the virtual electrode's mouth (i.e., the position where the cavity or other containment structure opens into a larger region of the plating vessel such as the region that contains the work piece being electroplated). Examples of virtual cathodes defined by cavities in insulating structures are shown as elements 347 and 348 in FIG. 3A, where the associated physical cathodes are shown as elements 340 and 342, respectively. An example of a virtual anode formed by a cavity and a highly ionically resistive structure is the high resistance virtual anode (HRVA) shown as element 311 in FIG. 3A, and associated with anode 306. Other virtual anodes are shown in FIG. 4 and the associated discussion in U.S. patent application Ser. No. 11/040,359, filed Jan. 20, 2005, which is incorporated herein by reference for all purposes.

Often a virtual electrode can be characterized by three elements: 1) a physical electrode, 2) a dielectric housing cavity containing ionic conductive electrolyte that confines the manner in which the ionic current flows to or from the physical electrode and 3) one or more cavity mouth(s). As indicated, the dielectric housing cavity structure essentially allows one to confine, direct, and/or focus the current delivered to, or emanating from, the cavity though the virtual electrode cavity mouth(s). Generally, the location of the associated physical electrode within the virtual electrode cavity allows the physical electrode influence to be substantially removed from the electrode's physical location and transposed to the virtual electrode's location.

In certain embodiments, the physical electrode within a virtual electrode cavity is located behind or below a membrane, such as a cationic conductive membrane. Such membrane may serve the purpose of limiting the physical electrode's exposure to plating bath additives, and/or preventing particles generated at the physical electrode from entering the main electrode chamber or traveling to the wafer surface. In some embodiments, the mouth of the virtual electrode cavity contains a high resistance porous dielectric element (a so called high resistance virtual anode or cathode plate). The inclusion of such a plate substantially increases the voltage drop therein, and allows the mouth of the virtual electrode to more closely approximate a uniform current source, which in some cases can increase the radial effectiveness of the virtual electrode and create a more uniform wafer current at a lower total auxiliary electrode current.

The non-conductive virtual electrode cavity structures (e.g. plastic walls) direct all or substantially all of the current coming from or going to the physical electrode that is housed internally in the virtual electrode cavity to emanate from or enter into the virtual electrode cavity mouth. The potential at the surface of a conductive physical electrode is typically approximately a single constant value. This condition may be, but is not necessarily, approximated at the virtual cavity mouth. It is understood that it is not necessary for the virtual cavity mouth to have all the properties of, or result in an identical current distribution at the virtual cathode/anodes mouth location that would occur if a physical electrode where located there. However, all current from the physical electrode must pass though the cavity mouth(s), and when the electrode, cavity, resistive element and other components are appropriately designed, both the potential and current distribution across the virtual electrode can be made to be substantially uniform. For example, the shape of the cavity can be modified to improve the uniformity of plating on the physical cathode. The virtual electrode mouth region is typically, though not necessarily, planar, annular, or conical, though other shapes are certainly possible. For many purposes, the virtual electrode mouth appears to act like a "real" physical electrode because it presents a surface where current passes into or out of a major cell element (e.g. main anode chamber). As indicated, this cavity mouth "surface" influences plating conditions by providing or consuming ionic current in the similar manner that a physical electrode would if the physical electrode were located at the position of the virtual electrode mouth.

Electroplating System with a HRVA and an Auxiliary Cathode

Figure 3A:
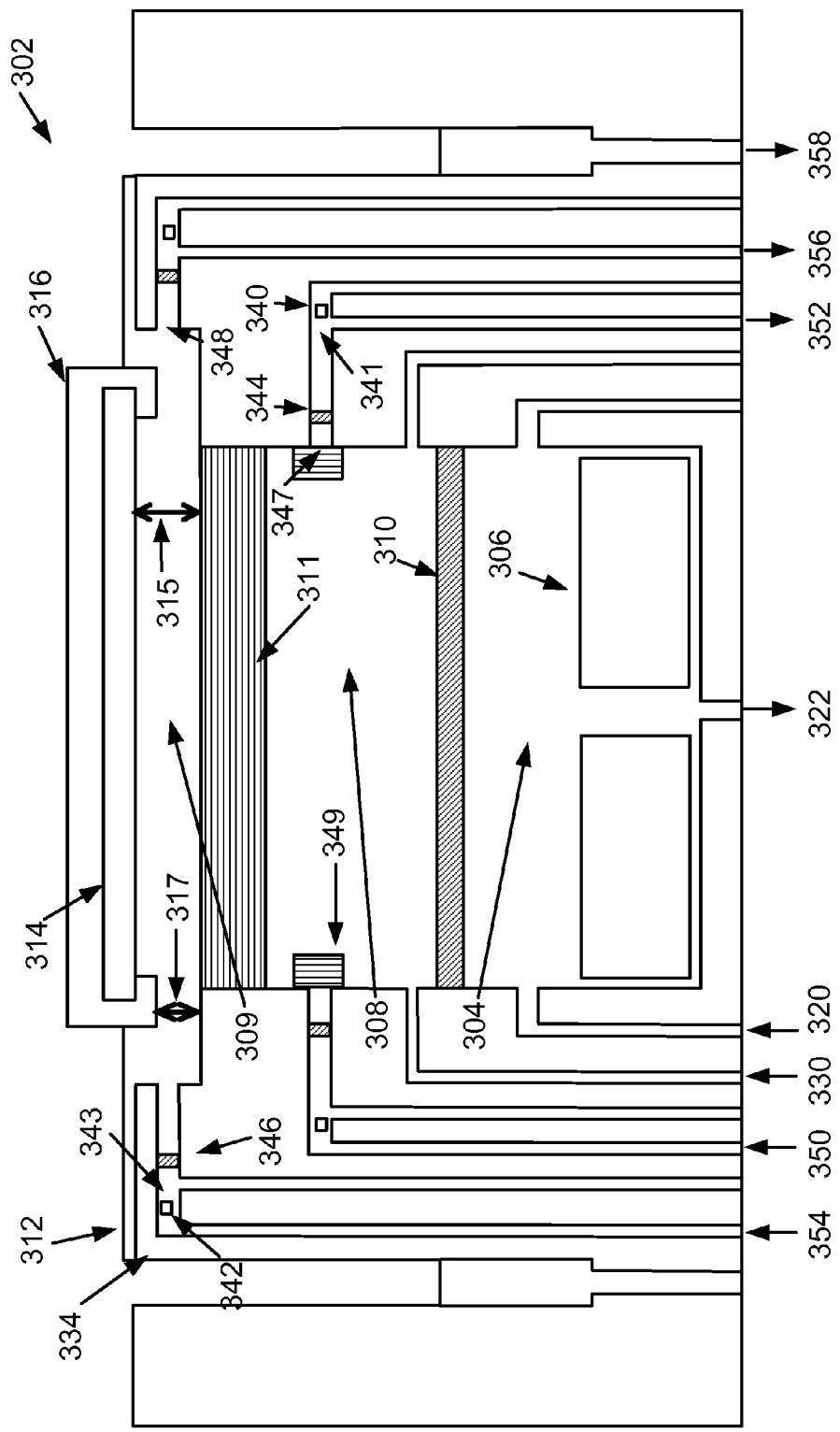
FIGS. 3A-3D are cross-sectional schematic views emphasizing different components of a representative electroplating apparatus in accordance with embodiments presented herein.
Figure 3B:
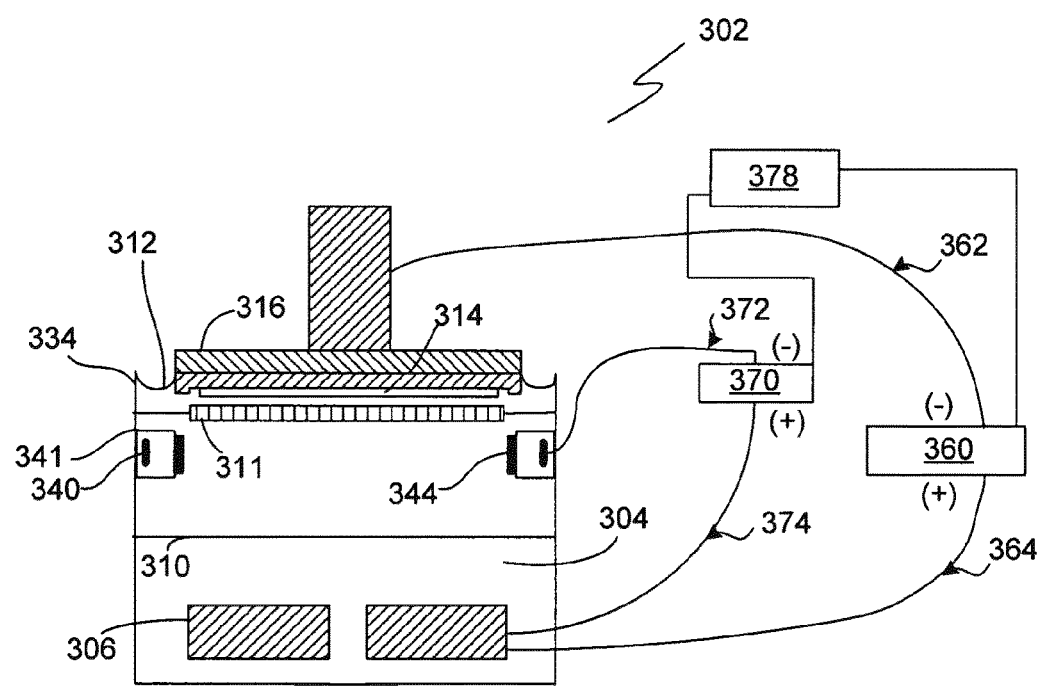
Figure 3C:
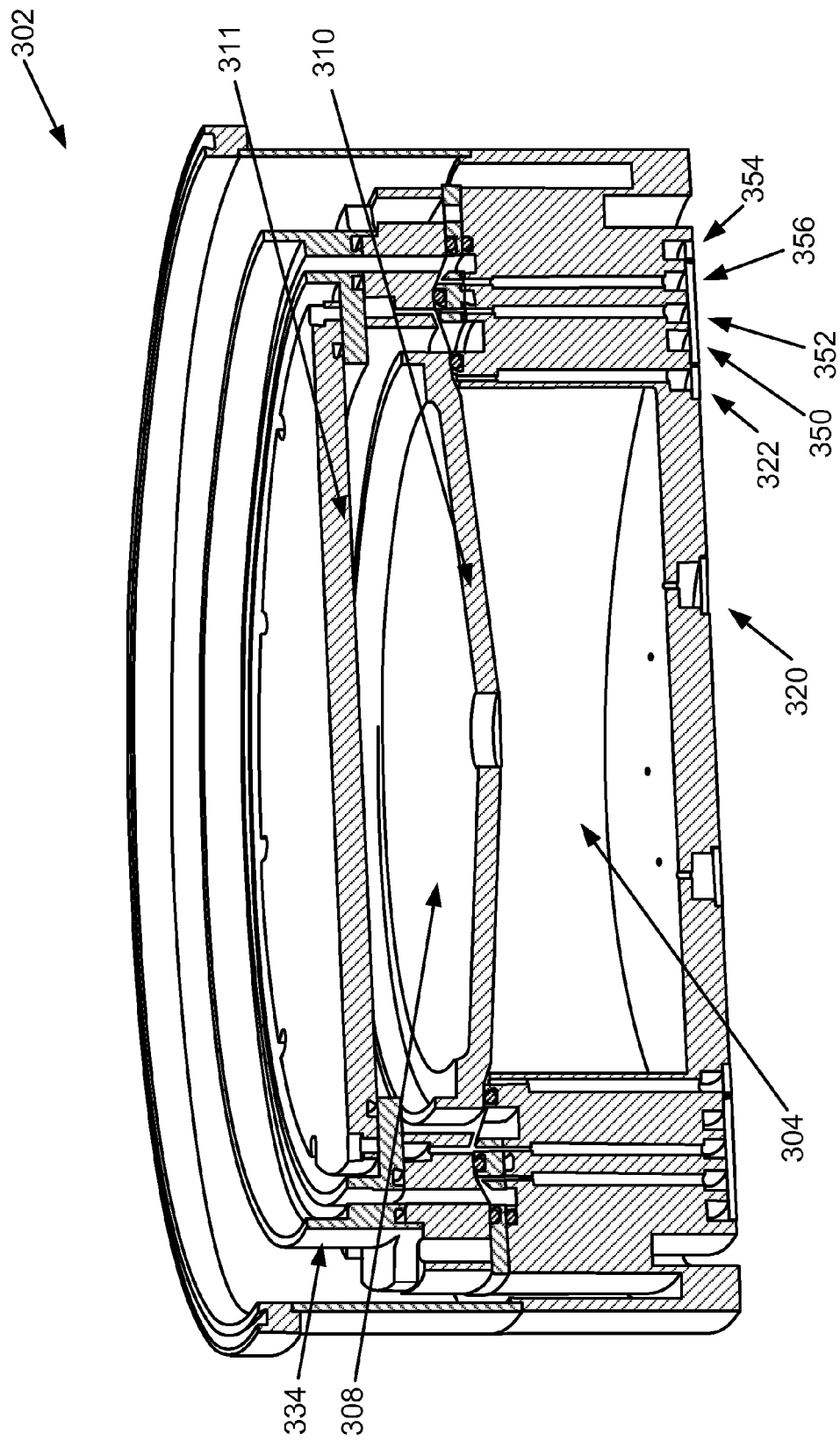
Figure 3D:
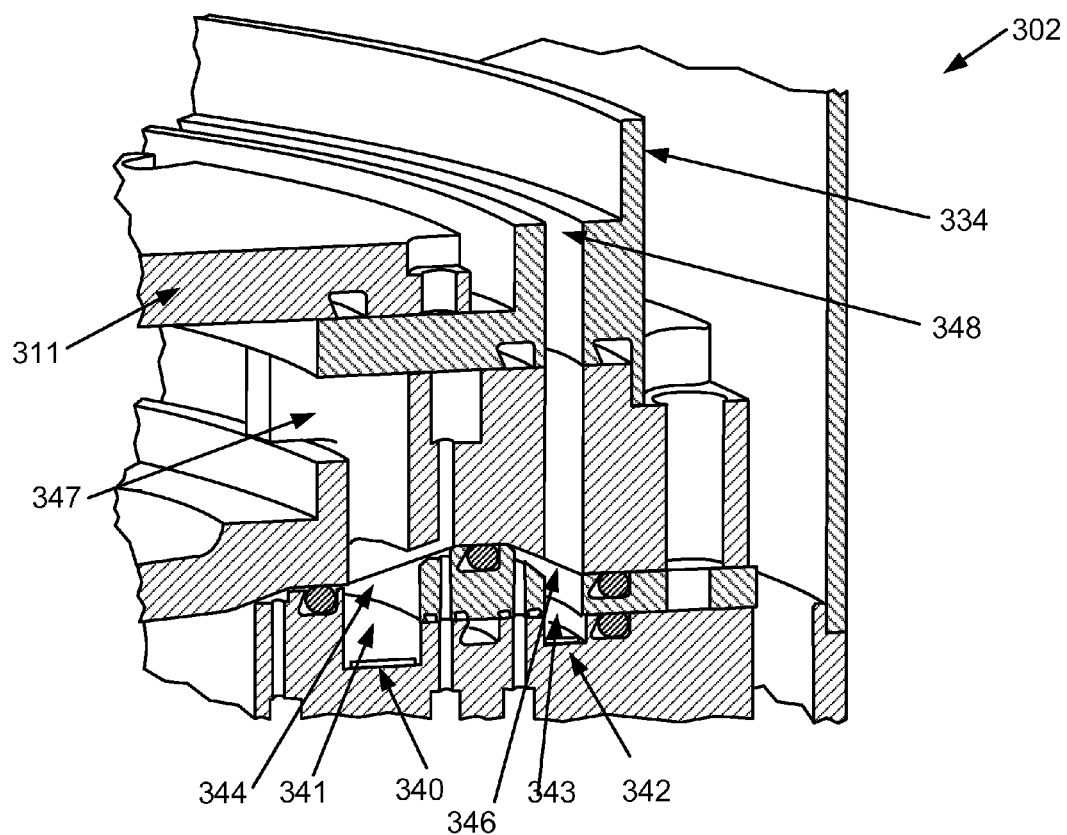
Figure 4:
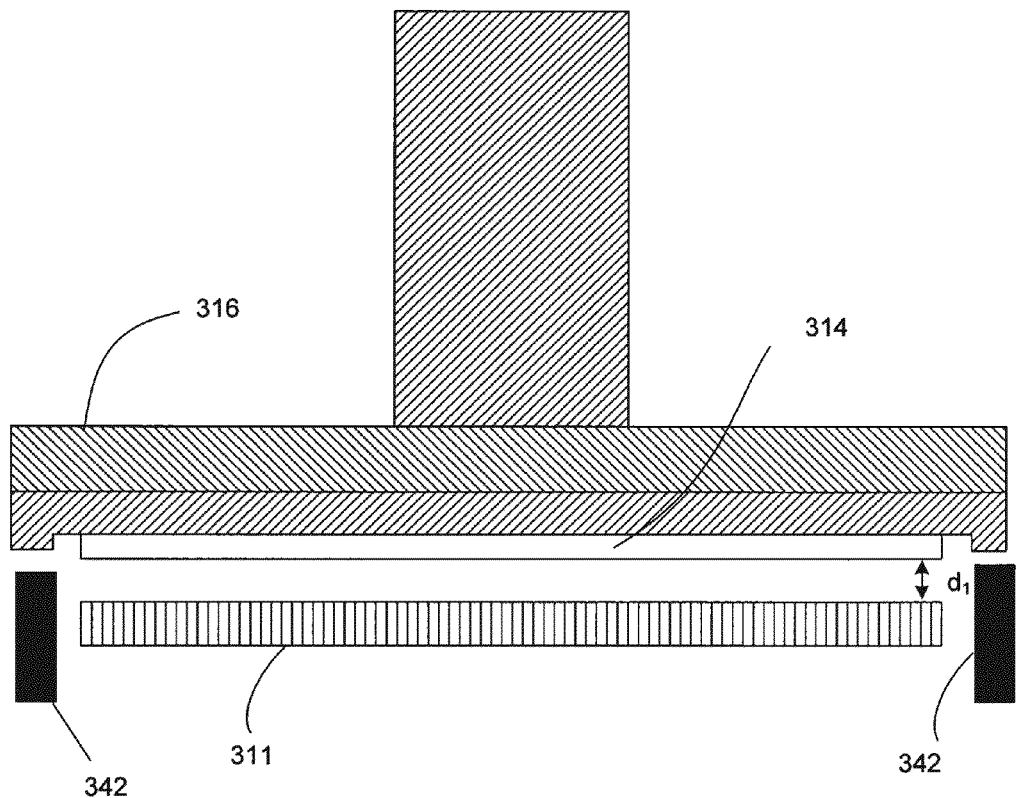
FIG. 4 is a cross-sectional view of the top portion of electroplating apparatus illustrating a wafer, a HRVA, and a second auxiliary cathode.

Illustrations of an electroplating apparatus, which employs a resistive element in close proximity to the wafer (i.e., a HRVA), an auxiliary cathode, and a second auxiliary cathode are shown in FIGS. 3A-3D. FIG. 3A is a diagrammatical cross-sectional view of an electroplating apparatus. FIG. 3B is a diagrammatical cross-sectional view of an electroplating apparatus including power supplies for a wafer and an auxiliary cathode. FIG. 3B does not show a second auxiliary cathode, a second auxiliary cathode power supply, or any electrolyte flow paths, for sake of clarity. FIGS. 3C and 3D are further cross-sectional views of an electroplating apparatus. The cross-sectional views in FIGS. 3A-3D are examples of a plating apparatus, and it is understood that the plating apparatus can be modified within the spirit and scope of appended claims. For example, the second auxiliary cathode need not be present in all embodiments. As another example, the auxiliary electrode can be below and part of the separated anolyte chamber (SAC) and have its current pass though the SAC chamber's cationic membrane instead of a separate membrane and different current path. As yet a further example, the HRVA need not be present in all embodiments.

Referring to FIGS. 3A-3D, a cross-sectional view of an electroplating apparatus 302 is shown. The electroplating system comprises an electroplating chamber that contains an anode chamber and a cathode chamber 309. The anode chamber includes two chambers, a "lower" anode chamber comprising the separated anolyte chamber (SAC) 304 where the anode 306 resides, and an upper diffusion chamber 308 (also referred to as a HRVA chamber or a catholyte chamber), separated from the separated anolyte chamber by a cationic membrane 310. The diffusion chamber contains a highly resistive ionically permeable element (i.e., HRVA) 311, described above, and an electrolyte solution (sometimes referred to as the catholyte), which is shown at a level 312. The separated anolyte chamber also contains an electrolyte solution (sometimes referred to as the anolyte), which may or may not be the same type of electrolyte in the diffusion chamber.

The HRVA 311 is located in close proximity of the wafer (within 10 mm, preferably within 5 mm) and serves as a high resistance ionic current source to the wafer. The element contains a plurality of 1D through holes and has been described in detail above.

A wafer 314 is immersed in the electrolyte solution (i.e., the catholyte). In some embodiments, the wafer holder 316 is a clamshell apparatus which makes contacts to the periphery of the wafer through a number of contact fingers housed behind a typically elastic "lip seal", which serves to seal the clamshell and keep the edge contact region and wafer backside substantially free of electrolyte, as well as to avoid any plating onto the contacts. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are both incorporated herein by reference for all purposes.

The clamshell is composed of two major pieces. The first piece of the clamshell is the cone, which can open allowing for insertion and extraction of the wafer. The cone also applies pressure to the contacts and the seal. The second piece of the clamshell is the wafer holding cup. The bottom of the cup typically needs to be made of (or coated with) an insulator to avoid any coupled corrosion and electrodeposition reaction which would occur, for example, on a metal that is placed into an electrolyte with a laterally varying potential, as is the case here. However, at the same time, the cup bottom needs to be mechanically strong. This is because it needs to be thin in order to avoid electrolyte flow disturbances near the wafer edge while being sufficiently strong to press the cup up against the wafer and cone while avoiding flexing. Therefore, in some embodiments the cup bottom is metal that is coated with an insulating material such as glass or plastic.

The cationic membrane 310 allows ionic communication between the separated anolyte chamber and the diffusion chamber, while preventing the particles generated at the anode from entering the proximity of the wafer and contaminating it. The cationic membrane is also useful in prohibiting non-ionic and anionic species such as bath additives from passing though the membrane and being degraded at the anode surface, and to a lesser extent in redistributing current flow during the plating process and thereby improving the plating uniformity. Detailed descriptions of suitable ionic membranes are provided in U.S. Pat. Nos. 6,126,798 and 6,569,299 issued to Reid et al., both incorporated herein by reference. A detailed description of suitable cationic membranes is provided in U.S. patent application Ser. No. 12/337,147, entitled Electroplating Apparatus With Vented Electrolyte Manifold, filed Dec. 17, 2008, incorporated herein by reference. Further detailed description of suitable cationic membranes is provided in U.S. patent application Ser. No. 61/139,178, entitled PLATING METHOD AND APPARATUS WITH MULTIPLE INTERNALLY IRRIGATED CHAMBERS, filed Dec. 19, 2008, incorporated herein by reference.

Electrolyte solutions are continuously provided to the separated anolyte chamber and the diffusion chamber by separate pumps (not shown). For the separated anolyte chamber, electrolyte enters the chamber at lower manifold 320 and exits at 322. For the diffusion chamber, electrolyte enters the chamber at manifold 330 and exits through 358 by flowing over weir wall 334.

Electroplating apparatus 302 also contains an auxiliary cathode 347 and a second auxiliary cathode 348. In the depicted embodiment, auxiliary cathode 347 and second auxiliary cathode 348 are virtual cathodes. Associated with auxiliary cathode 347 and second auxiliary cathode 348 are physical cathodes 340 and 342, respectively. All of the embodiments shown in FIGS. 3A-3D include virtual cathodes and associated physical cathodes In other embodiments, one or both of the virtual cathodes are replaced by physical cathodes, and the physical cathode is simply located at the position of the virtual cathode. The electroplating apparatus performs in a similar manner with either virtual cathodes or physical cathodes (with no virtual cathodes). The use of virtual cathodes provides advantages, however, as discussed below.

Auxiliary cathode 347 is located below the HRVA. It is positioned in the anode chamber (i.e., either the diffusion chamber or the sealed anode chamber). In the embodiment shown in FIGS. 3A-3D, the auxiliary cathode is located above the cationic membrane, in the diffusion chamber. In the embodiment shown in FIGS. 3A-3D, auxiliary cathode 347 comprises physical cathode 340, housed in a chamber 341 with its own electrolyte flow circuit and pump (not shown). In some embodiments, the size of the auxiliary cathode (i.e., the height of the opening of the virtual cathode chamber) is about 5 to 15% (in certain embodiments, about 10%) of the radius of the wafer being plated. In FIGS. 3A-3D, electrolyte enters the auxiliary cathode chamber 341 at 350 and exits at 352. The auxiliary cathode chamber is separated from the diffusion chamber 308 by an ion-permeable membrane 344. A rigid framework may provide support for the membrane. The membrane 344 allows ionic communication between the diffusion chamber 308 and the auxiliary cathode chamber 341, thereby allowing the current to be diverted to the auxiliary cathode 347. The porosity of membrane 344 is such that it does not allow particulate material to cross from the auxiliary cathode chamber 341 to the diffusion chamber 308 and result in wafer contamination. In some embodiments, the ion-permeable membrane 344 is a cationic membrane, such as Nafion, and the membrane does not result in a significant ionic resistance (as compared, for example, element 349 described below). Other mechanisms for allowing fluidic and/or ionic communication between the auxiliary cathode chamber and the anode chamber are within the scope of this invention, including the ionic membranes and cationic membranes noted above. Examples include designs in which an impermeable wall, in addition to the membrane 344, provides some of the barrier between the electrolyte in the anode chamber and the electrolyte in the auxiliary cathode chamber.

In some embodiments, the physical cathode 340 associated with the auxiliary cathode 347 is an annularly shaped strip of metal located within the auxiliary cathode chamber 341. The physical cathode 340 is connected to a power supply 370 by, for example, a feed-through connector attached to an electrode cable (not shown). The metal composing the physical cathode 340 and its surface is preferably inert under electroplating conditions. Examples on inert metals which can be used as a physical cathode include tantalum, tungsten, titanium, palladium or platinum, a palladium or platinized metal substrate such as titanium or tungsten or tantalum, iridium, iridized titanium and the like. In some embodiments, the same material that is being plated as the physical cathode material is used. For example, a copper-comprising physical cathode may be used when copper is plated.

The dimensions of the auxiliary cathode chamber 341 and of the physical cathode 340 may vary depending on the needs of electroplating process. In some embodiments, the width of the physical cathode is about 10 to 20% (about 15% in certain embodiments) of the radius of the wafer being plated. In one embodiment, the physical cathode is a strip of metal, having a thickness of about 0.1 to 2 mm, a width of about 0.5 to 5 cm, and a length traversing the outer peripheral region of the anode chamber. Embodiments of other cathode configurations include circular bars (O-shaped toroids), C-shaped bars, coils having a circular configuration in which individual coils define a small circle and the overall coiled structure surrounds the main plating vessel in the auxiliary cathode or anode chamber.

While the auxiliary cathode chamber need not be restricted to a fractional volume, it is generally smaller than the anode chamber, having a volume of about 1 to 20% of the anode chamber, and in some embodiments, around 5%. As described above, it is generally desirable to have the auxiliary cathode located relatively close to the lower surface of the HRVA, so that the current does not have the space in which to redistribute before reaching the wafer surface. The distance, d, between the lower surface of the HRVA and the auxiliary cathode should generally be about equal to or less than the radius, r, of wafer onto which metal is being plated (i.e., d~≦r). In embodiments where a HRVA is not employed, the distance, d, between the wafer and the auxiliary cathode should generally be about equal to or less than 1.3 times the radius, r, of the wafer onto which metal is being plated (i.e., d~≦1.3r). The auxiliary cathode should also be significantly above the plane of the anode so the current from the anode has space to change directions without unduly large auxiliary cathode voltages or currents.

In further embodiments, a high ionically resistive porous membrane 349, generally similar in construction to that of the HRVA itself, though not requiring particularly small or numerous holes, is positioned between the auxiliary cathode chamber and the anode chamber. Such a membrane serves to shape the current distribution to the sides of the electroplating cell, making it more uniform. A membrane for this purpose typically has between about 1 to 5% porosity. It may or may not include small one-dimensional holes. The resistance of the membrane 349 in this function is generally commensurate with the resistance of the HRVA 311 in front of the wafer, improving the current distribution uniformity to the auxiliary electrode, as well as making the current at the virtual auxiliary electrode mouth more uniforn/consistent. In certain embodiments, the high ionically resistive porous membrane 349 is less than about 25 mm thick, and preferably about 12.5 mm thick. Exemplary hole diameter sizes in membrane 349 are between about 1 and 10 mm. Slots or other openings can also be used.

In some cases, when using an auxiliary cathode located below a plating substrate in an electroplating apparatus, it may be desirable not to use a HRVA 311. For example, such a HRVA-free system might be sued when the wafer's sheet resistance is not greater than about 5 ohm per square. In some cases, the auxiliary cathode alone (preferably, but not necessarily, in combination with a second auxiliary cathode located above the anode chamber and peripheral to the wafer holder, described in more detail below) may be capable of improving the uniformity of the current density experienced by the wafer to a sufficient level without the additional cost and complexity of an HRVA.

The second auxiliary cathode 348 is located outside the anode chamber, outside of the HRVA-to-wafer gap 315, and outside of the peripheral gap 317. As noted above, the second auxiliary cathode in the embodiment shown in FIGS. 3A-3D is a virtual cathode. The second auxiliary cathode, similar to the auxiliary cathode, has an associated second physical cathode 342, a chamber 343 and may contain its own electrolyte flow loop, pump (not shown), and cationic membrane 346, as shown in FIGS. 3A-3D. In FIGS. 3A-3D, electrolyte enters the chamber 343 at 354 and exits at 356. The cationic membrane 346 allows ionic communication between the second auxiliary cathode chamber and the plating cell, while preventing any particles generated at the second auxiliary cathode from entering into the plating chamber. Further details regarding the configuration of the second auxiliary cathode are given in U.S. application Ser. No. 12/291,356 filed Nov. 7, 2008, previously incorporated by reference.

In some embodiments, the second physical cathode of the second auxiliary cathode includes multiple segments, where each of the segments can be separately powered by a separate power supply or using one power supply having multiple channels adapted to independently power segments of the second physical cathode. Such a segmented second physical cathode is particularly useful for plating on non-circular or asymmetrical wafers, such as wafers having flat regions. While fairly uncommon today, some wafers contain wafer "flats", a cut out arc of the wafer at the wafer edge, used, for example, for alignment. In general, however, a segmented second physical cathode having independently powered segments can be used with any kind of workpiece (symmetrical or not), as it allows fine-tuning plating uniformity. Specifically, a segmented second physical cathode can be used for providing current corrections at different azimuthal positions of the wafer.

Because current density at the wafer flat region will generally be different than the current density at the circular regions of the wafer, a different amount of current needs to be diverted from the wafer flat part as compared from the other parts. Accordingly, in one embodiment, the second physical cathode segments are powered in concert with wafer rotation, such that a first level of current is supplied to the segments aligned with the wafer flat region, while a second level of current is supplied to the second physical cathode segments aligned with the circular portions of the wafer.

The second physical cathode segments can be located below, at the same level, or above the wafer, either in the same plating chamber as the wafer or in a different plating chamber in ionic communication with the main plating chamber. Any arrangement of the segments can be used, as long as the segments are aligned with different azimuthal positions about the wafer. The number of segments can vary depending on the needs of the process. In some embodiments between about 2-10 segments are used.

While a multi-segmented second physical cathode of a second auxiliary cathode is particularly useful with a 1-D HRVA disposed in close proximity of the wafer, as was described above, this is a separate embodiment which can be used both independently and in combination with various plating apparatus features disclosed herein.

Power Supplies for the Electroplating Apparatus

In certain embodiments, one or more power supplies are provided for the work piece and the one or more auxiliary cathodes. In some cases, a separate power supply is provided for each auxiliary cathode and the work piece; this allows flexible and independent control over delivery of power to each cathode. In the embodiment depicted in FIG. 3, three DC power supplies are used for controlling current flow to the wafer 314, to physical cathode 340 (associated with auxiliary cathode 347), and to physical cathode 342 (associated with second auxiliary cathode 348). In FIG. 3B, only two power supplies, one for wafer 314 and one for physical cathode 340, are shown for the sake of clarity. The power supply 360 has a negative output lead 362 electrically connected to wafer 114 through, e.g., one or more slip rings, brushes and/or contacts (not shown). The positive output lead 364 of power supply 360 is electrically connected to an anode 306 located in the separated anode chamber 304. Similarly, a power supply 370 has a negative output lead 372 electrically connected to the physical cathode 340, and a positive output lead 374 electrically connected to anode 306. Alternatively, one power supply with multiple independently controllable electrical outlets can be used to provide different levels of current to the wafer and to the auxiliary cathode. The power supplies 360 and 370 can be connected to a controller 378, which allows for independent control of current and potential provided to the wafer and auxiliary cathode of the electroplating apparatus. The second physical cathode (not shown in FIG. 3B) is connected to a power supply (not shown) in a similar matter to the physical cathode.

During use, the power supplies 360 and 370 bias the wafer 314 and the physical cathode 340, respectively, to have a negative potential relative to anode 306. Power supply 360 causes an electrical current to flow from anode 306 to wafer 314, plating metal onto the wafer. Power supply 370 causes the electrical current flowing from anode 306 to wafer 314 to be partially or substantially diverted to auxiliary cathode 347. The electrical circuit described above may also include one or several diodes (not shown) that will prevent reversal of the current flow, when such reversal is not desired. An undesired current feedback may occur during plating, since the anode 306 which is set at ground potential is the common element of both the wafer and the auxiliary circuits. A power supply for the second auxiliary cathode operates in a similar manner.

With separate power supplies for both the auxiliary cathode and the second auxiliary cathode, the current applied to each of the cathodes may be dynamically controlled. As a wafer is electroplated with metal, the sheet resistance decreases and the current non-uniformity may be reduced, making the auxiliary cathode unnecessary after a certain thickness of metal is achieved. The current supplied to the auxiliary cathode may be dynamically controlled to account for a reduction of the wafer's sheet resistance and the associated more uniform current distribution that normally results without the activation of the auxiliary electrode. In some embodiments, no current is supplied to the auxiliary cathode after the sheet resistance of the wafer drops to a defined level such as about 1 ohm per square or lower.

Good plating uniformity can be achieved with an appropriately designed HRVA for sheet resistances below about ½ ohm per square. Therefore, the EIRIS current can be essentially reduced to near zero below this resistance value. More generally, if the plating process is started with a film having a sheet resistance of 100 ohm or more per square, for example, the EIRIS current can be significantly reduced once the sheet resistance drops below about 20 ohm per square, more preferably or more extensively when the resistance drops below 10 ohms per square. As noted above, EIRIS current generally is not required at values below ½ ohm per square. If the film being plated is copper, these sheet resistances approximately correspond to thicknesses less than 15 Å (100 ohm per square), 50 Å (20 ohm per square), 100 Å (10 ohm per square) and 500 Å (0.5 ohm per square) of copper on the wafer In yet further embodiments, depending on the current density applied to the wafer, and therefore the rate of reduction of the wafer sheet resistance, no current or substantially no current is supplied to the auxiliary cathode after metal is plated onto the wafer for a set duration such as a period of about 20 seconds of less, or in other embodiments for a period of about 5 seconds or less.

The current may be reduced to the auxiliary cathode and/or the second auxiliary cathode simply by turning the current supplied to each cathode off. The current may also be constant for a period of time and then decrease monotonically, or alternatively decrease monotonically starting from when the electroplating process is initiated, or from a time shortly thereafter. The current supplied to the second auxiliary cathode may also be dynamically controlled in a manner that is driven by and in some manner follows (e.g. is made to match proportionately) the auxiliary cathode current. One or both of the auxiliary electrode currents can be tied or otherwise manipulated dynamically in a proportionate manner to the total wafer current. The current supplied to the auxiliary (and/or second auxiliary cathode) may also be dynamically controlled in a manner using an algorithm calculated from and/or time shifted from (e.g. initiation delayed until reaching a threshold trigger current level or time since initiation of plating) the current flowing through the wafer, anode or auxiliary cathode. The current supplied to the auxiliary cathode and the second auxiliary does not need to be decreased in the same manner or at the same rate. The current supplied to any of the wafer, anode, auxiliary and secondary electrode may also be pulsed. The pulse can be simple current on/off pulses with symmetric or different duration of on and off times. Alternatively, current forward and reverse pulses of different magnitudes and durations may be used. Control of the current supplied to one or more auxiliary electrodes is described in U.S. Pat. No. 6,168,693 issued to Uzoh et al., which is herein incorporated by reference in its entirety and for all purposes.

In one embodiment, the auxiliary and secondary cathodes are tied together with a resistor in the line of one of them after an in-line-tee split, the line coming from a single power supply that is used to energize both cathodes simultaneously. In other embodiments, separate power supplies for both the auxiliary cathode and the second auxiliary cathode are employed and allow for different current levels at different times for each of the cathodes. In a specific embodiment, when current is initially supplied to the auxiliary cathode, the ratio of the current supplied to the auxiliary cathode and to the substrate is at least about 1:2 (i.e. half of the total wafer current), and in a further specific embodiment is at least about 5:1 (i.e. five times the total wafer current). The current supplied to the second auxiliary cathode is typically about 10% of the current supplied to the wafer (i.e., 1:10). Current levels for the second auxiliary cathode are described in more detail in U.S. application Ser. No. 12/291,356, which was previously incorporated by reference.

An example of one possible current-time profile for an electrodeposition process is described below. When the electrodeposition process is first started for a 300 mm wafer, a 5 A current may be supplied to the wafer, a 25 A current may be supplied to the auxiliary cathode, and a 0.5 A current may be supplied to the second auxiliary cathode. After a 5 second time period has passed, the current supplied to the auxiliary cathode is ramped down in a linear fashion from 25 amps to 0 A over an ensuing 10 second time period, while keeping a constant 5 A current and 0.5 A current supplied to the wafer and the second auxiliary cathode, respectively. After a total of 20 seconds have passed, the current to the secondary cathode is turned off (set to zero). In this case, for the first 5 seconds, 30.5 Amps is supplied from the anode. From 5 to 15 seconds, the current from the anode decreases from 30.5 to 5.5 Amps. After 20 seconds the current to the anode drops to 5 amps and only the current from the anode to the wafer remains. It is understood that the best profile for a given circumstance depends on numerous factors such as the initial wafer sheet resistance, the plated film specific resistivity, the plating bath conductivity, plating bath additive influences, flow of the plating bath, as well as other factors associated with the physical cell design, so no one current-time profile is suitable for all cases. The optimum current-time profile therefore is best determined experimentally or estimated mathematically (i.e. using a computer model).

Controller 378 in conjunction with power supplies 360 and 370 allows for independent control of current and potential provided to the wafer, the auxiliary cathode, and the second auxiliary cathode of the electroplating apparatus. Thus, controller 378 is capable of controlling power supplies 360 and 370 to generate the current profiles described above. The controller, however, generally is not capable of independently determining if one of the conditions described above (e.g., sheet resistance reaching a level of 1 ohm per square or lower) has been met, though an estimate of the sheet resistance can be made based on a known total cumulative amount of charge passed to the wafer though lead 362 at any given time. Thus, the controller may be used in conjunction with sensors that may determine whether a condition has been met. Alternatively, the controller may simply be programmed with a separate current versus time profile for each of the wafer, auxiliary cathode, and second auxiliary cathode. The controller may also measure the charge (coulombs=integral of amperage*time) supplied to the wafer, auxiliary cathode, and second auxiliary cathode, and base the current-time profile on these data.

Controller 378 may be configured to control electrical power delivered to the auxiliary cathode in a manner that produces a more uniform current distribution from the anode after electroplating a defined amount of metal onto the substrate or after electroplating for a defined period of time. Controller 378 may also be configured to control electrical power delivered to a second auxiliary cathode adapted for diverting a portion of ionic current from an edge region of the substrate. Furthermore, controller 378 may be configured to ramp down electrical power delivered to the auxiliary cathode and the second auxiliary cathode, each at different rates, as metal is deposited on the substrate. Additionally, controller 378 may be configured to supply no current or substantially no current to the auxiliary cathode after the sheet resistance of the substrate surface reaches about ½ ohm/square or less or metal is plated onto the substrate for a period of about 5 seconds or less.

Controller 378 may also be configured to control the level of current supplied to the auxiliary cathode and to the substrate. In one embodiment, the ratio of current supplied to the auxiliary cathode and the substrate is at least about 1:2 when the current plating begins. In another embodiment, the ratio of current supplied to the auxiliary cathode and the substrate is at least about 5:1 when the current plating begins.

Physical Shields

A close-up view of another configuration comprising an ionically resistive ionically permeable element and a second auxiliary cathode is illustrated in FIG. 4. Only the wafer 314, the second auxiliary cathode 342, and the ionically resistive element 311 are illustrated to preserve clarity (i.e., elements generally found below the HRVA 311 are excluded). In this configuration the second auxiliary cathode is located close to the wafer, but the exact positioning of the second auxiliary cathode is somewhat flexible, particularly when the gap between the wafer and/or wafer holder and the HRVA plate is small and creates a virtual cathode cavity by the positional combination of these elements. The ionically resistive ionically permeable HRVA element is located opposite the wafer and parallel to it at a close distance $d_1$. This distance, in one embodiment, is less than about 5 mm, or less than about 3 mm. In a different embodiment, the distance is not greater than about 5% (more preferably about 2%) of the diameter of the work piece's circular region.

Figure 5:
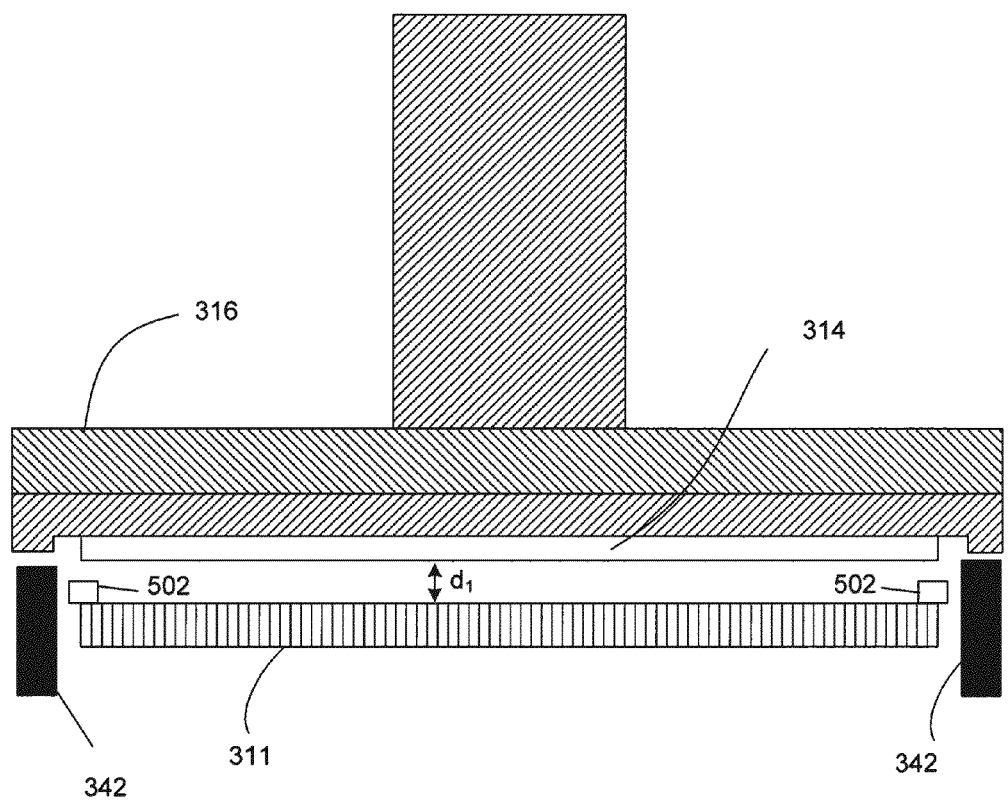
FIG. 5 is a cross-sectional view of the top portion of electroplating apparatus illustrating a wafer, a HRVA, a second auxiliary cathode, and a stationary shield positioned above HRVA and on the periphery of HRVA.

Another embodiment of a configuration employing an ionically resistive element is shown in FIG. 5. While a primary auxiliary cathode is not depicted in FIGS. 4 and 5, it is understood that it is present at a location below the HRVA. In this embodiment, a static insulating shield 502 resides about the perimeter of the resistive element to further improve edge-center plating uniformity. Optionally, the configuration also includes a second auxiliary cathode 342. The shield may reside directly on or slightly above the resistive element 311 and may eclipse some of the through-holes on the periphery of the resistive element. Generally, in the lateral (x-direction) such shield can be completely peripheral to the resistive element (outside its perimeter), partially peripheral (a portion of the shield is outside and a portion is inside the perimeter, as shown), or fully on top of the outer edge of the element (completely inside the perimeter of the resistive element). Vertically (in y-direction) the shield resides between the wafer and the resistive element, at the same level or below.

When the shield resides above the HRVA it can be used to make the peripheral gap smaller. This is particularly advantageous when a second auxiliary cathode is used. By using different shields and the same HRVA, the relative size of the peripheral gap vs. HRVA-to-wafer gap can be modulated independently. A separate function of the shield, according to some embodiments, is to eclipse some holes of the HRVA, thereby blocking current passing through those holes. The shield may be configured (by its size, location, dynamic movement, etc.) to change the number and location of open holes so as to tune the current profile for a particular application. Advantageously, these parameters can be modulated by using the same HRVA and selecting a shield suitable for a particular application, e.g., creating a desired peripheral gap, a desired pattern of blocked holes, etc. Changing the lateral extent or other dimensions of the shield allows for manipulation of the more static (thick-film) plating uniformity of the HRVA system, and minimizes the number of unique (an generally costly) HRVA designs and constructions, allowing one base HRVA configuration to be adapted to a wide range of uses and changes in the plating solution (plating metal, plating additives, bath conductivities, etc.) and initial metalized wafer characteristics (seed film type, composition and thickness). While in some embodiments the static shield is a ring, as illustrated in FIG. 5, in other embodiments the shield can be bat-wing shaped, or have another azimuthally asymmetric shape.

Additionally, other shields can be positioned within the plating chamber between the HRVA and the anode (e.g., below the HRVA in wafer-facing-down systems). The shields are usually ring-shaped dielectric inserts, which are used for shaping the current profile and improving the uniformity of plating, such as those described in U.S. Pat. No. 6,027,631 issued to Broadbent, which is herein incorporated by reference in its entirety and for all purposes. Other shield designs and shapes may be employed as are known to those of skill in the art.

In general, the shields may take on any shape including that of wedges, bars, circles, ellipses and other geometric designs. The ring-shaped inserts may also have patterns at their inside diameter, which improve the ability of the shields to shape the current flux in the desired fashion. The function of the shields may differ, depending on their position in the plating cell. The apparatus of the present invention can include any of the static shields, as well as variable field shaping elements, such as those described in U.S. Pat. No. 6,402,923 issued to Mayer et al. and U.S. Pat. No. 7,070,686 issued to Contolini et al., both of which are herein incorporated by reference in their entireties. In some embodiments, variable field shaping elements placed below a HRVA can be used in place of an EIRIS (to accomplish similar results as the EIRIS), or alternatively, in conjunction with an EIRIS. An apparatus of embodiments of the present invention can also include any of the segmented anodes, such as described in U.S. Pat. No. 6,497,801 issued to Woodruff et al. or concentric anodes, such as described in U.S. Pat. Nos. 6,755,954 and 6,773, 571 issued to Mayer et al., all of which are herein incorporated by reference in their entireties.

In some examples, a variable field shaping element is a mechanical iris that changes the size of an aperture, or a strip having different sizes of apertures that may be shifted to vary the size of an aperture that is aligned with the wafer. The shield may be raised and lowered to vary a distance that separates the shield from the substrate. The wafer or the shield may be rotated to average field inconsistencies that are presented to the substrate. The shield may have a wedge shape that screens a portion of the wafer from an applied field as the wafer rotates. The shield may also be tilted to present more or less surface area for screening effect.

In one embodiment, a flange or object-holding device having a variable field shaping element, such as an inflatable bladder, is placed in the electrochemical reactor. In one example, a flange is used to hold a work piece in the plating cell. The flange provides an ability to control field potential at the surface of the work piece and may include three primary sections, which may be bonded together, bolted, or integrally formed.

In one example, an object-retaining segment establishes electrical contact with the margins of work piece. The object-retaining segment holds the work piece to present a surface of the work piece for electrochemical reaction. In some cases, an inflatable elastomeric bladder is disposed around the work piece-retaining segment in a manner permitting selective inflation and deflation of the bladder. The bladder shields a corresponding surface area on the work piece held in the object-retaining segment from electric field potential. In a further example, an intermediate segment separates the object-retaining segment from the inflatable bladder to prevent the inflatable bladder from damaging objects held in the object-retaining segment.

The adjectival terms "variable," "dynamic," "dynamically variable" and similar terms herein generally mean that a dimensional or operational variable or parameter of an apparatus or method is selectively changed during the treatment of a wafer. In particular, a variable or parameter is dynamically varied to shape an electric field and thereby to accommodate the changing electrical properties of a deposited metal layer as layer thickness increases (or decreases in layer removal treatments) during electrochemical treatment operations. The term "time-variable" and similar terms are used more or less synonymously with terms such as "dynamic".

The apparatus configurations described above are illustrations of embodiments of the present invention. Those skilled in the art will appreciate that alternative plating cell configurations that include an appropriately positioned auxiliary cathode and second auxiliary cathode may be used. While shielding inserts are useful for improving plating uniformity, in some embodiments they may not be required, or alternative shielding configurations may be employed.

Comparison of Four Different Electroplating System Configurations

FIG. 6A-6D are cross-sectional schematic views of four different electroplating apparatus configurations and including a substrate having a seed layer with a generally high sheet resistance (e.g., 1 ohm per square or higher, or in the cases of very high resistance, 10 ohms per square or higher). Lines of constant potential (602) and lines of current flow (604) are illustrated on the cross-sectional schematics. Also shown are representative plots of current density versus radial position in each of the electroplating cells.

Figure 6A:
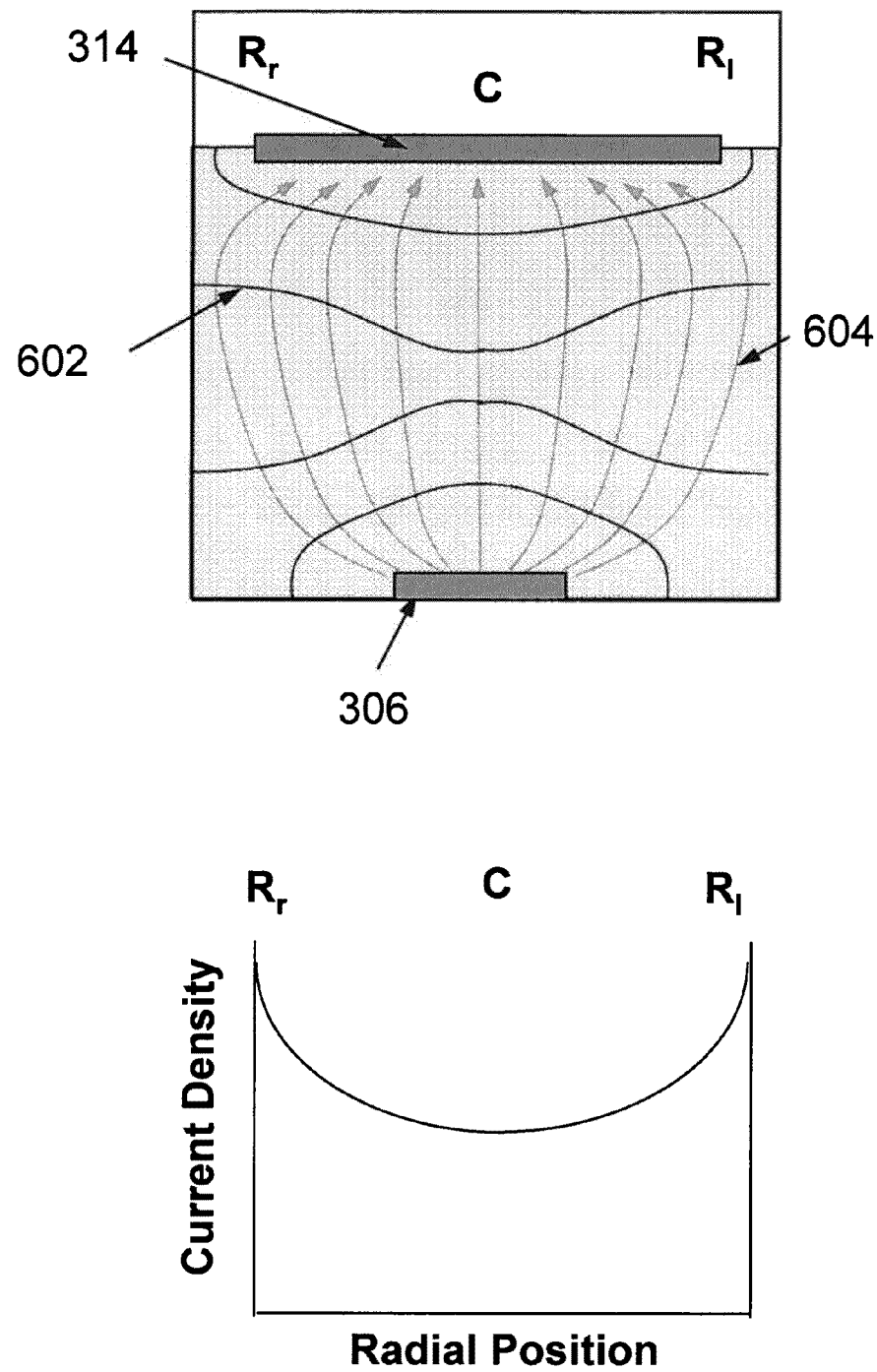
FIG. 6A-6D are cross-sectional schematic views of four different electroplating apparatus configurations. Current and voltage lines are illustrated on the cross-sectional schematics. Also shown are representative plots of current density versus radial position for each of the electroplating apparatuses.

FIG. 6A illustrates an electroplating apparatus that does not include a HRVA, an auxiliary cathode, or a second auxiliary cathode. The current density results are representative of the plating of a 1 ohm per square wafer in such a configuration. As explained above, due to the high resistance to ionic current and the center of the wafer (C) and low resistance at the edges of the wafer ($R_r$ and $R_1$), the ionic current density is low at the center and high at the edges. Such a current density leads to edge-thick metal deposition profiles.

Figure 6B:
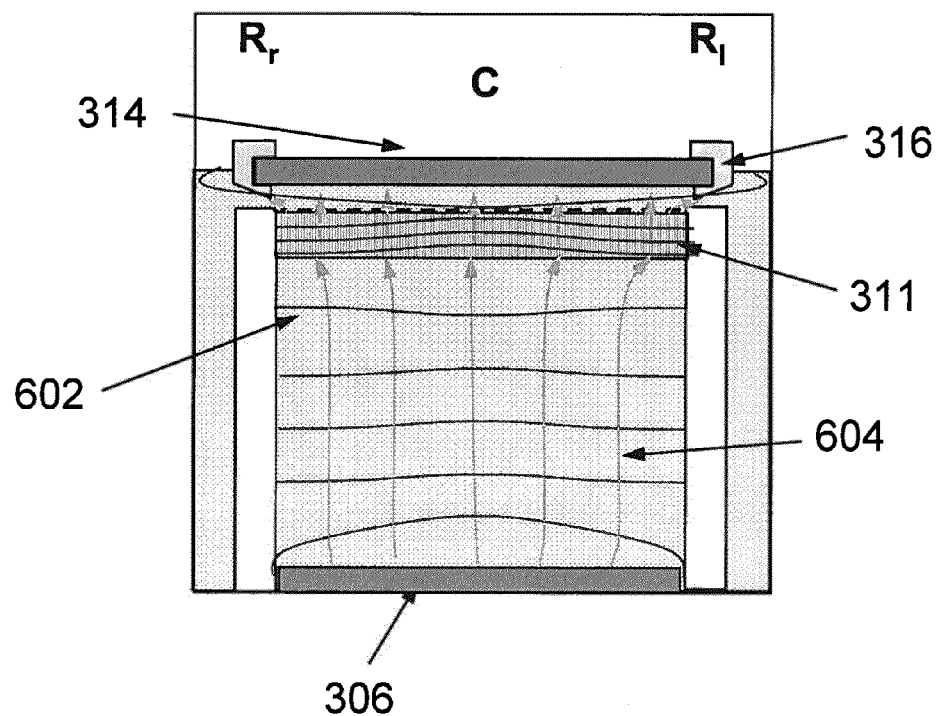
Figure 6B:
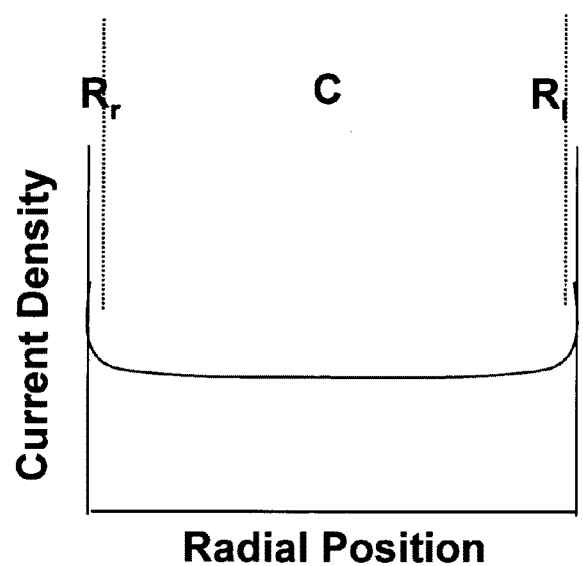

FIG. 6B illustrates an electroplating apparatus that includes a HRVA, but not an auxiliary cathode or a second auxiliary cathode. The current density results are representative of the plating of a 1 ohm per square wafer in such a configuration. The use of a HRVA makes the current density largely insensitive to anode-to-HRVA spacing and the physical counter electrode size, as discussed further, below. As shown in the current density profile, use of a HRVA provides a much more uniform current density across the entire wafer. Some fraction of the current, however, still leaks at the HRVA edges, again resulting in an edge-thick deposition profile, indicated by the increase in current in the radial region outside the dotted line.

Figure 6C:
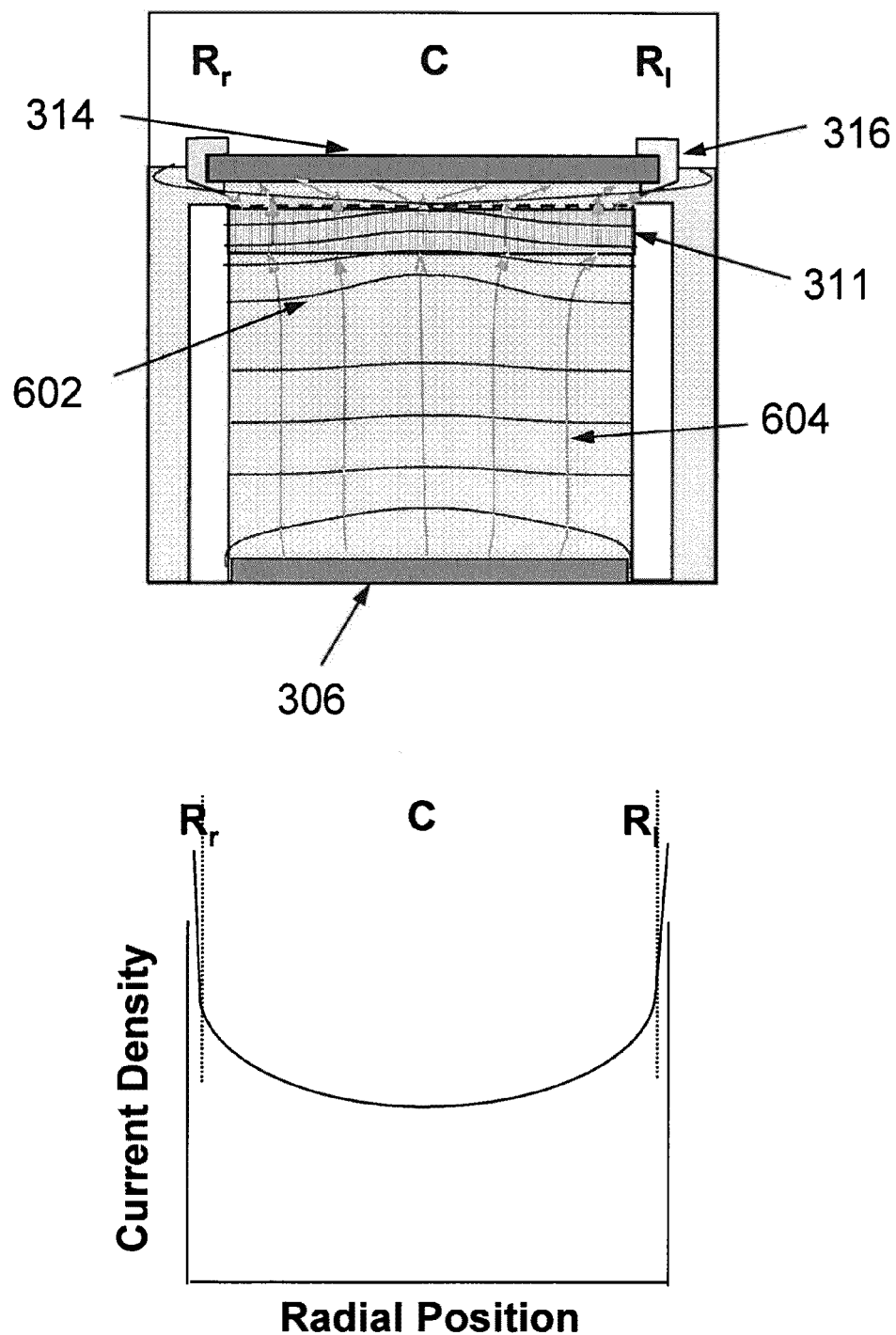

FIG. 6C illustrates an electroplating apparatus that includes a HRVA, but not an auxiliary cathode or a second auxiliary cathode (i.e., identical to FIG. 6B). However, in this figure the current density results are representative plating performed on a seed wafer with a resistance of, for example, 10 ohm per square or higher. The use of a HRVA makes the current density largely insensitive to anode-to-HRVA spacing and the physical counter-electrode size, but the plating uniformity is much worse than for the 1 ohm per square wafer. Use of a HRVA provides a much more uniform current density across the entire wafer than if no HRVA were employed, but the plating uniformity variation is still very significant. Similar to FIG. 6B, some fraction of the current, however, still leaks at the HRVA edges, again resulting in a particularly high near-edge-thickness deposition profile indicated by the further increase in current in the radial region outside the dotted line.

Figure 6D:
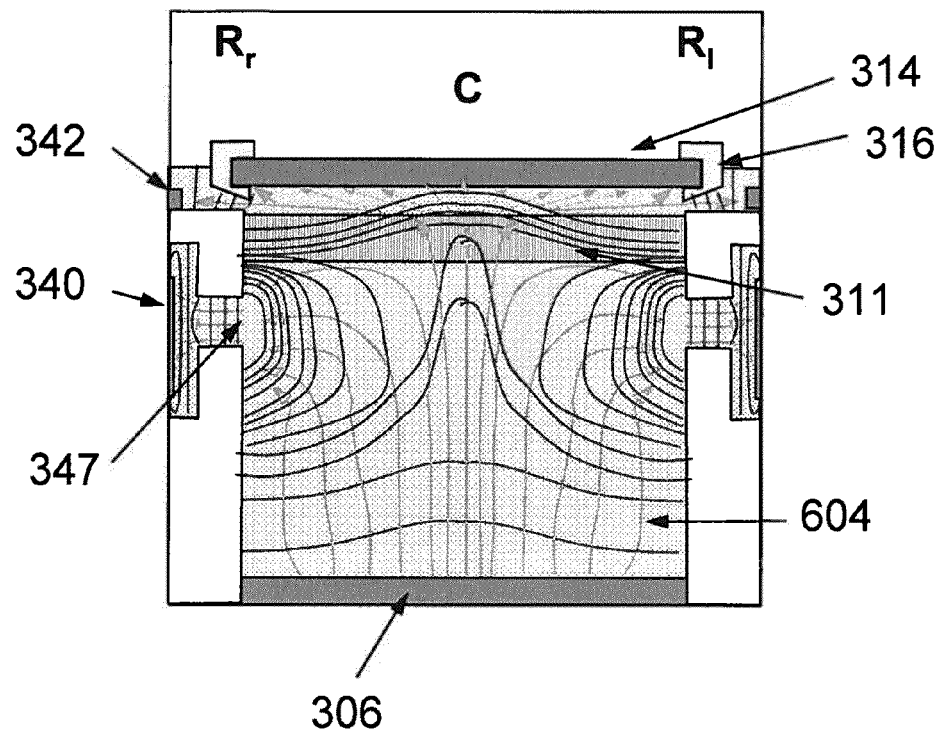
Figure 6D:
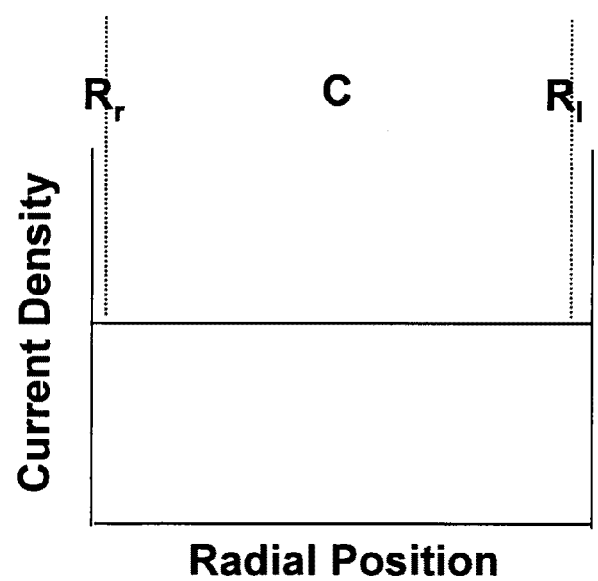

FIG. 6D illustrates an electroplating apparatus that includes a HRVA, an auxiliary cathode, and a second auxiliary cathode, with plating performed on a seed wafer with a resistance of, for example, 10 ohm per square or higher. The current density profile can be modified by varying the sizes of various elements (including the physical counter electrode and the electroplating cell) and the positions of various elements (including the HRVA, the auxiliary cathode, and the second auxiliary cathode). As discussed above, the current supplied to the wafer, the auxiliary cathode, and the second auxiliary cathode can also be dynamically varied. The dimensions of the HRVA and currents supplied to the wafer, auxiliary cathode, and second auxiliary cathode can be controlled to yield a uniform current density across the entire wafer (as shown in the current density plot), resulting in flat metal deposition profile, even when the substrate sheet resistance is very high (typically during the initial few seconds of deposition).

It should be understood that the result obtained with the apparatus of FIG. 6D may be achieved not only for films whose sheet resistances are the same as in FIG. 6A and FIG.

6B (about 1 ohm per square or lower), but also for films with sheet resistances equal to and greater than the sheet resistances of the film for FIG. 6C (greater than about 10 ohm per square). The general utility of the method and apparatus of this invention can be appreciated by the fact that in addition to uniform plating on very high resistance wafers, when not utilizing (energizing) the auxiliary electrode of the apparatus of FIG. 6D, the uniform current distribution observed for a relatively low sheet resistance wafer (less than about 1 ohm per square) may also be obtained, as can be obtained from the apparatus of FIG. 6B, or with low sheet resistances (less than about 0.2 ohm per square) from the apparatus of FIG. 6A. Therefore, the apparatus of FIG. 6D has a range of applicability in terms of uniform plating on both very high and very low sheet resistance wafers, with the ability to plate with at least equally good uniformity on wafers with relatively low sheet resistances that might be obtained from apparatus of FIG. 6A or 6B.

Positioning and Shape of an Anode

In the presence of a HRVA, which serves as a virtual current source, the positioning of the physical (metal) anode (a positively biased member of the plating chamber) may be relatively unimportant, or certainly less important than in the absence of a HRVA in the system. Therefore, while in some embodiments the actual anode (a positively biased electrode) is aligned with the wafer and with the resistive element and is disposed opposite to the wafer surface, in other embodiments, the anode is not aligned with the wafer, as it may be shifted to the side with respect to the wafer, be placed in a separate chamber, or may have dimensions (e.g., diameter) substantially different from those of the wafer. In some embodiments, the anode is disk-shaped and is aligned with the wafer. In other embodiments the anode may be positioned asymmetrically. In yet other embodiments, multiple anodes are used. In still other embodiments, the anode is positioned remotely from the chamber or housing inside an ancillary virtual anode chamber with insulating chamber walls.

Process Flow Embodiment

Figure 7:
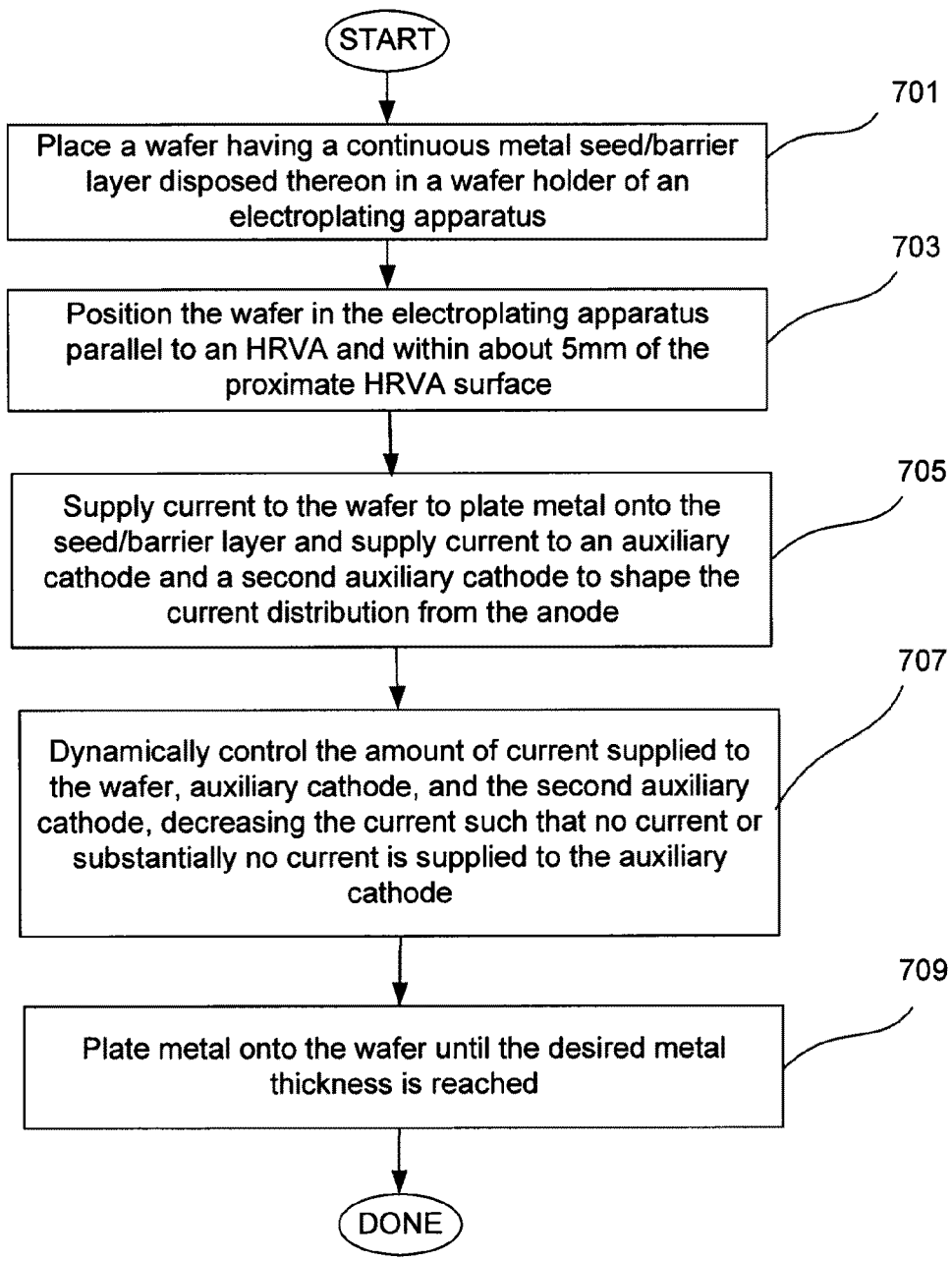
FIG. 7 is a process flow diagram for an electroplating apparatus incorporating a HRVA, an auxiliary cathode, and a second auxiliary cathode, in accordance with an embodiment presented herein.

An example of an electroplating method in an apparatus equipped with a HRVA, an auxiliary cathode, and a second auxiliary cathode is illustrated in the process flow diagram of FIG. 7. In the depicted embodiment, the process starts in an operation 701 by placing or receiving the wafer into a wafer holder of the electroplating apparatus. The wafer can be placed in a horizontal or in a tilted orientation with respect to the plane of electrolyte in the bath.

Next, in an operation 703, the wafer is put into contact with the catholyte and is placed horizontally and parallel to HRVA, preferably within about 5 mm or less of HRVA, where the distance refers to the distance between the bottom wafer surface immersed in electrolyte and the proximate HRVA surface. After the wafer is positioned in the electrolyte (or while the wafer is being immersed), in operation 705, current is supplied to the wafer in order to plate metal onto the seed/barrier layer. Such current is provided by controlling the current and/or the potential of the wafer. A reference electrode can be used to control the potential between the wafer and the reference electrode, preferably located in the region above the HRVA and below or to the side of the wafer. Current (typically, but not limited being cathodic current) is also supplied to the auxiliary cathode and the second auxiliary cathode in operation 705 to shape the current distribution from the anode such that current density is relatively flat at the wafer surface. Anodic current from the either electrode will tend to have the reverse effect on the plating uniformity than cathodic current, tending to increase the amount of plating at the edge or near edge. The wafer, auxiliary cathode and second auxiliary cathode are all connected via one or more power supplies, each with one or more power supply channels, to an anode. In a particular embodiment, each of these is connected individually to the same single anode, located within an anode chamber. In other embodiments, the various auxiliary cathodes may be connected to some of the same anodes, and some anodes which other cathodes or the wafer are not connected to.

In operation 707, current supplied to the wafer, the auxiliary cathode, and the second auxiliary cathode is dynamically controlled. The current supplied to the auxiliary cathode and, optionally, to the second auxiliary cathode is decreased such that no current or substantially no current is supplied to these cathodes after a condition is met. These conditions include, e.g., the sheet resistance of the wafer reaching about 1 ohm per square or lower, at least about 100 angstrom of metal being plated onto the wafer, or a period of time elapsing, as discussed above. Metal is then plated onto the wafer in operation 709 until the desired metal thickness is reached.

Note that in some embodiments, the deposition may be divided into fill and overburden phases. Typically, the current increases significantly during the overburden phase, sometimes by about 5 to 10 times. For example, if a 300 millimeter wafer receives about 5 A of current during the fill phase, it may receive about 30 to 40 A during the overburden phase. Further adjustments may be made to the current supplied to the auxiliary cathode and the second auxiliary cathode during the overburden deposition to aid in electromechanical polishing. Such adjustments may include creating a non-uniform current density that is experienced by the wafer.

Experimental Results

Figure 8A:
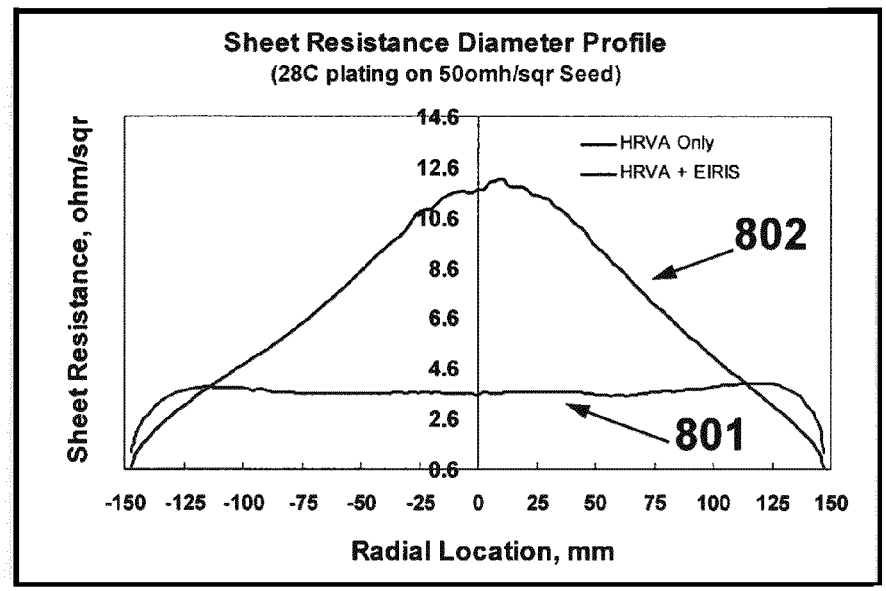
FIG. 8 is a plot showing the post-plating sheet resistances and calculated film thicknesses of wafers, having initial sheet resistances of 50 ohm per square, plated with copper.
Figure 8B:
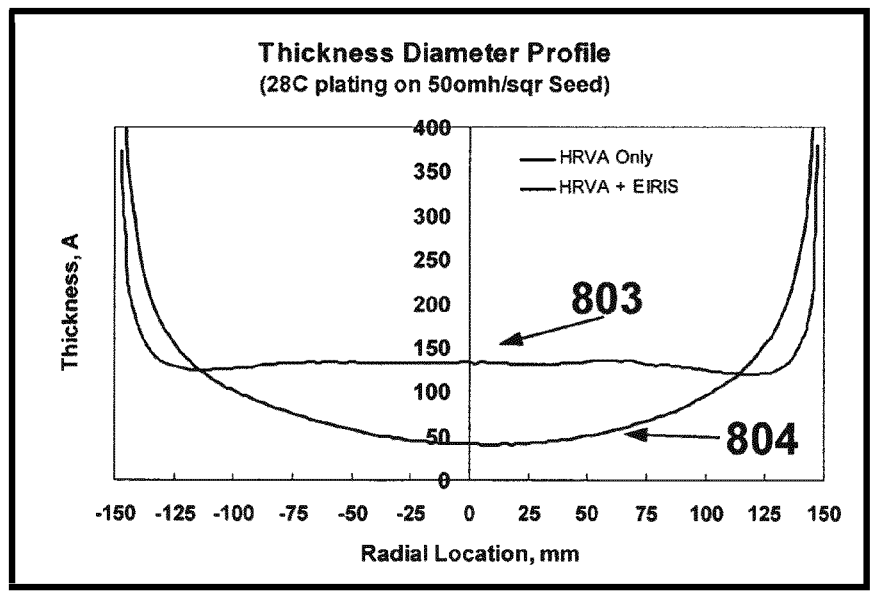

FIGS. 8A and 8B show the post-plating sheet resistance and calculated film thickness (using the known thin film thickness-dependent specific resistivity and the measured sheet resistance) of a wafers, having an initial sheet resistance of 50 ohm per square, plated with copper. Line 801 is the final sheet resistance of the plated film, and line 803 is the final calculated plated film thickness of the wafer processed in a cell in accordance with embodiments of this invention, the cell having both a high ionic resistance membrane (HRVA) and an auxiliary electrode within and above an anode in an anode chamber. The HRVA employed had about 9000 individual 0.026" diameter 1-dimensional holes that resulted in a total plate porosity of about 5%. The ionically resistive ionically permeable HRVA element was 12.7 mm thick and the front surface of the wafer was positioned 3.5 mm from the HRVA top surface. A ring-shaped EIRIS auxiliary electrode, 20 mm in height and about 1 mm in thickness was positioned inside a peripheral cavity of the anode chamber. The peripheral virtual electrode cavity, within which the above physical electrode was housed, had a depth of about 10 mm (electrode on the outer/back surface), an average height of 20 mm, and walls that restricted the flow of current from the physical electrode to the virtual electrode mouth connecting to the anode chamber parallel to the wafer plane. The virtual electrode "mouth" was between 10 and 30 mm below the HRVA bottom face. The anode was positioned at the bottom of the anode chamber or cavity 115 mm below the HRVA bottom face.

The total wafer current, current density, charge and plating time applied to the wafer was 2 amps, 2.8 mA/cm$^2$, 28 coulombs, and 14 seconds, respectively. The current applied to the auxiliary electrode was a constant 10 A, also for 14 seconds. As can be seen from the flat, non-radial dependent sheet resistance and film thickness, a uniform copper film was deposited. The center thickness is about 135 Å and the thickness at 125 mm from the edge is about 125 Å. At the very edge, beyond about 135 mm, the sheet resistance tends to be very low and the thickness becomes quite large as current leaks from the edge of the HRVA to reach the wafer edges. However, a secondary cathode, peripheral to the wafer and above the HRVA as described above, was not employed in this test, and had it been, this edge current would have been effectively reduced, enabling a uniform current distribution right to the edge of the wafer.

In a contrasting experiment demonstrating the value of adding the EIRIS electrode to this system, all the physical and process parameters of the wafer, the ionically resistive ionically permeable HRVA element, and various cell element physical spacings were kept constant, but the auxiliary electrode was not energized (i.e., no current was applied). Curves 802 and 804 are the corresponding post-plating sheet resistance and calculated film thicknesses for this case, showing a very non-uniform plating thickness across the entire wafer surface. The center thickness in this case is about 45 Å and the thickness at 125 mm is over 150 Å.

In some cases, where the auxiliary electrode is not employed, or it is not employed in combination with a HRVA, and/or other unfavorable processing conditions are present (e.g., various current densities, bath properties such as conductivity, or wafer sheet wafer resistance), no plating occurs in the center of the wafer at all and the center thickness is found to be almost zero, or the wafer metal may even corrode in the center. This phenomenon is possibly associated with the unusually large and uncompensated terminal effect creating conditions where plating (i) can not overcome the nucleation activation energy or potential to start the process, or (ii) is so small that background corrosion dominates there.

Figure 9:
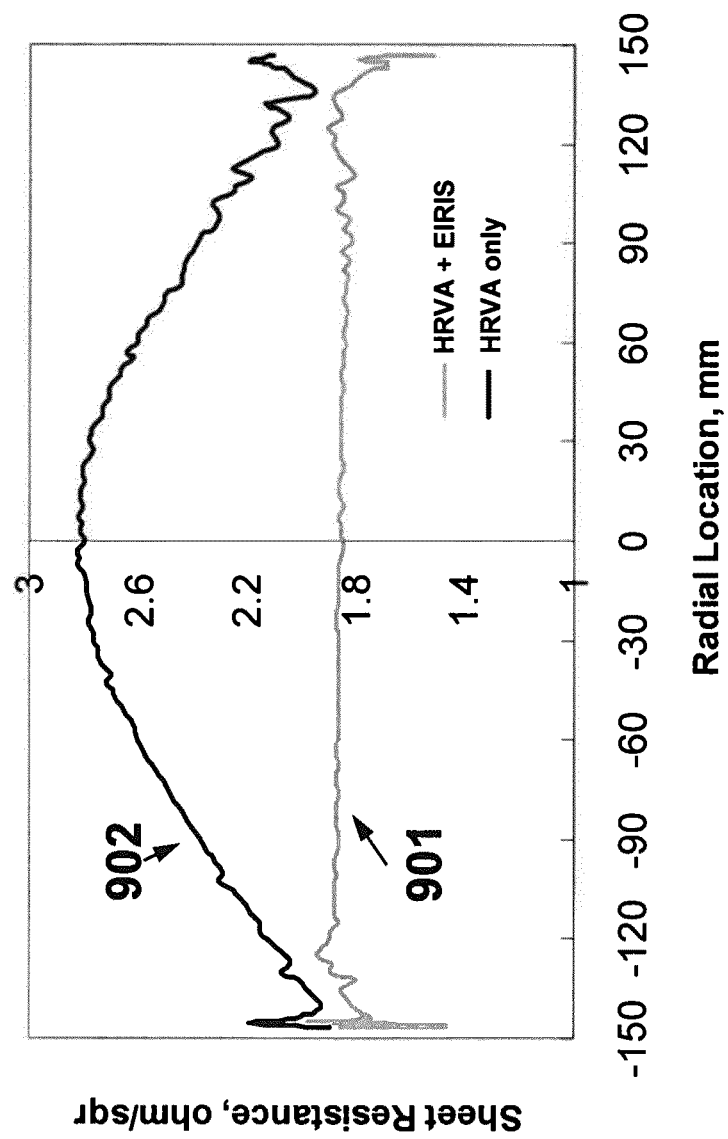
FIG. 9 is a plot showing the post-plating sheet resistances of wafers, having initial sheet resistances of 10 ohm per square, plated with copper.

FIG. 9 is a similar comparison of FIG. 8A for an ionically resistive ionically permeable HRVA element vs. a HRVA and EIRIS auxiliary-cathode combined system, but for a less resistive 10 ohm per square seed film. The physical arrangement and the applied current of this test was similar to that described for FIG. 8, except as noted hereafter. Curve 901 is the result with a 2 A current applied to the wafer and 4 amps applied to the auxiliary electrode, both for 14 seconds. No secondary cathode was employed for the test corresponding to Curve 901. As can be seen for curve 901, the sheet resistance is very flat with radius, except out to the very edge beyond about 135 mm, where the sheet resistance increases associated with a thicker film and no secondary cathode compensation, similar to curve 801. Curve 902 is a comparative experiment, where the EIRIS auxiliary electrode was not used or energized (0 amps applied), but a second auxiliary cathode was energized for 14 seconds at a current of 0.2 A. The sheet resistance of curve 902 is very high in the center and non-uniform across the wafer. Because of the utilization of the second auxiliary cathode, the edge sheet resistance does not continue to decrease. In fact, the sheet resistance actually increases at the edge, which is due to the fact that a second auxiliary cathode with an applied current of less than 0.2 A or application of the current for a shorter time would have been optimal.

Figure 10:
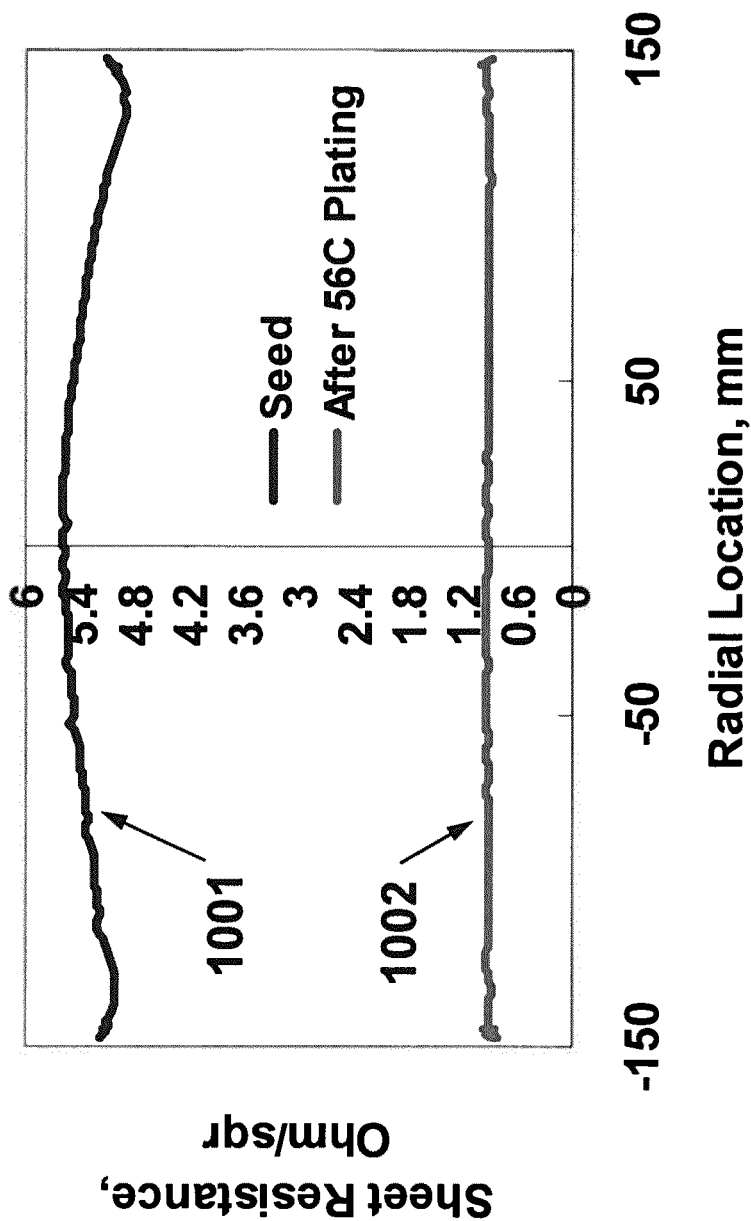
FIG. 10 is a plot showing the pre-plating sheet resistance and a post-plating sheet resistance of a wafer plated using embodiments of the disclosed invention.

FIG. 10 shows a 5 ohm per square PVD sputtered copper seeded wafer plated in the same cell configuration as described with respect to FIG. 8, but in this case having and employing the an ionically resistive ionically permeable HRVA element, auxiliary and second auxiliary cathodes. The initial sheet resistance profile 1001 is reasonably uniform. The wafer was plated at 2 A for 28 seconds in a copper plating bath. During the first 14 seconds, a current of 4 amps was applied to the auxiliary electrode and a current of 0.2 amps was applied to the secondary cathode. For the final 14 seconds, no current was applied to either the auxiliary or secondary electrodes. As can been seen, a final sheet resistance of about 0.8 ohms per square over the entire surface was achieved.

Numerical Modeling

Figure 11:
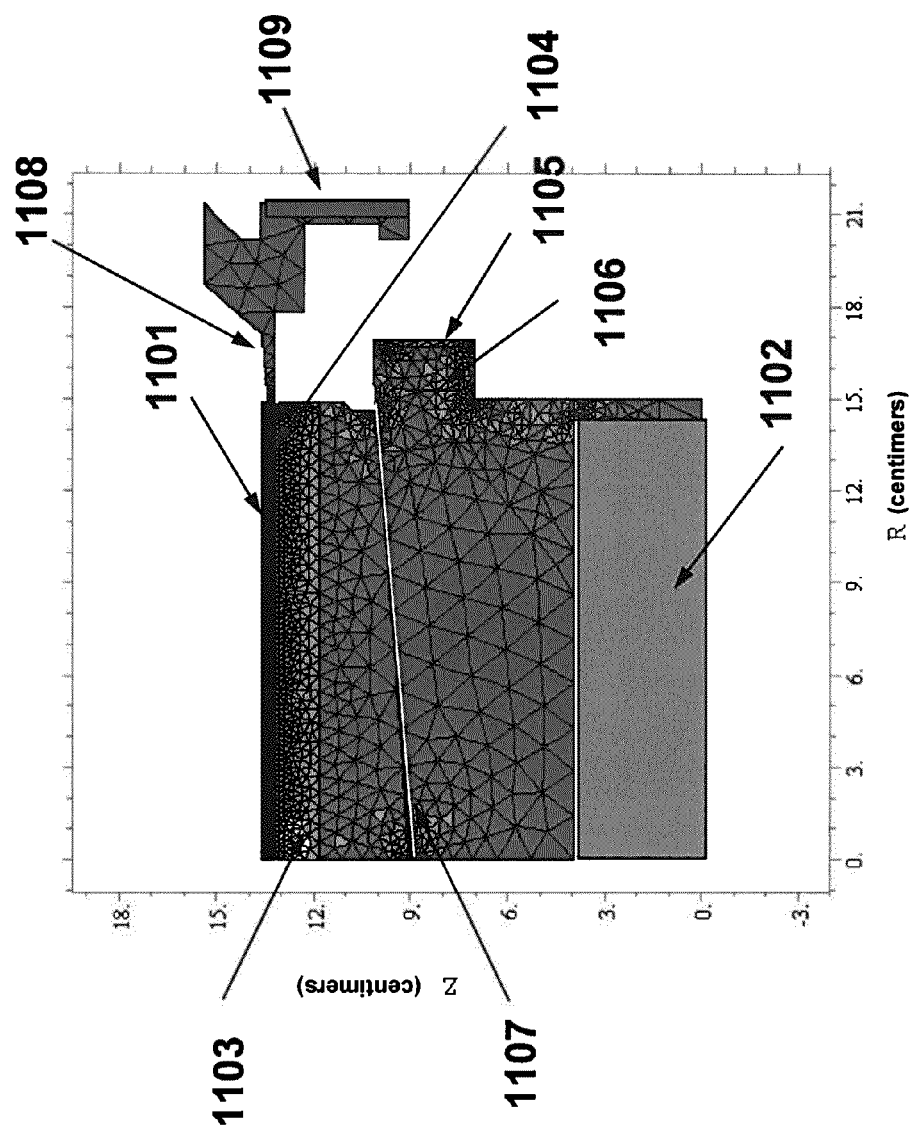
FIG. 11 is a finite element mesh used for numerical simulations of embodiments of the present invention.

To further improve the understanding of the interactions of the system components, finite element numerical modeling using the commercial software FlexPDE™ was performed to compare the various plating systems (i.e., with or without an ionically resistive ionically permeable HRVA element and with or without an auxiliary electrode). The HRVA physical properties used in the simulations were the same as that described for FIG. 8. The mesh and layout of the simulation are shown in FIG. 11. The wafer 1101 lies above the HRVA 1103 and is separated from the HRVA top surface by a gap 1104. The wafer is held in an insulating holder, outside the wafer surface 1108. The second auxiliary cathode physical electrode 1109 is outside the gap created by the wafer holder 1108 and the material peripheral to the HRVA, but was not energized in any of the simulation results presented here. The anode 1102 resides at the bottom of the cell. For this simulation, the anode 1102 and the virtual auxiliary cathode 1106, which contains the physical auxiliary cathode 1105, all reside below a cationic upper to lower chamber separating membrane 1107. Because the specific conductivity of this layer (i.e., the membrane) is close to that of the electrolyte (better than $\frac{1}{10}^{th}$ that of the electrolyte), and it is so thin (less than about 0.5 mm), its presence does not appreciable change the system's total resistance or response appreciably. However, in practical operations, the electrolyte in the region above the membrane versus that below it may be different, and the inclusion allows for different conductivities of the regions in the model. For simplicity, the data shown here used the same electrolyte conductivity though the cell. That is, the conductivity in the wafer to HRVA gap, in the 1-dimensional HRVA holes, and in the rest of the cell was equal to that of a typical copper plating electrolyte (e.g., a 10 g/L sulfuric acid, 40 g/L copper ion plating solution), about 6 ohm$^{-1}$ m$^{-1}$.

Figure 12:
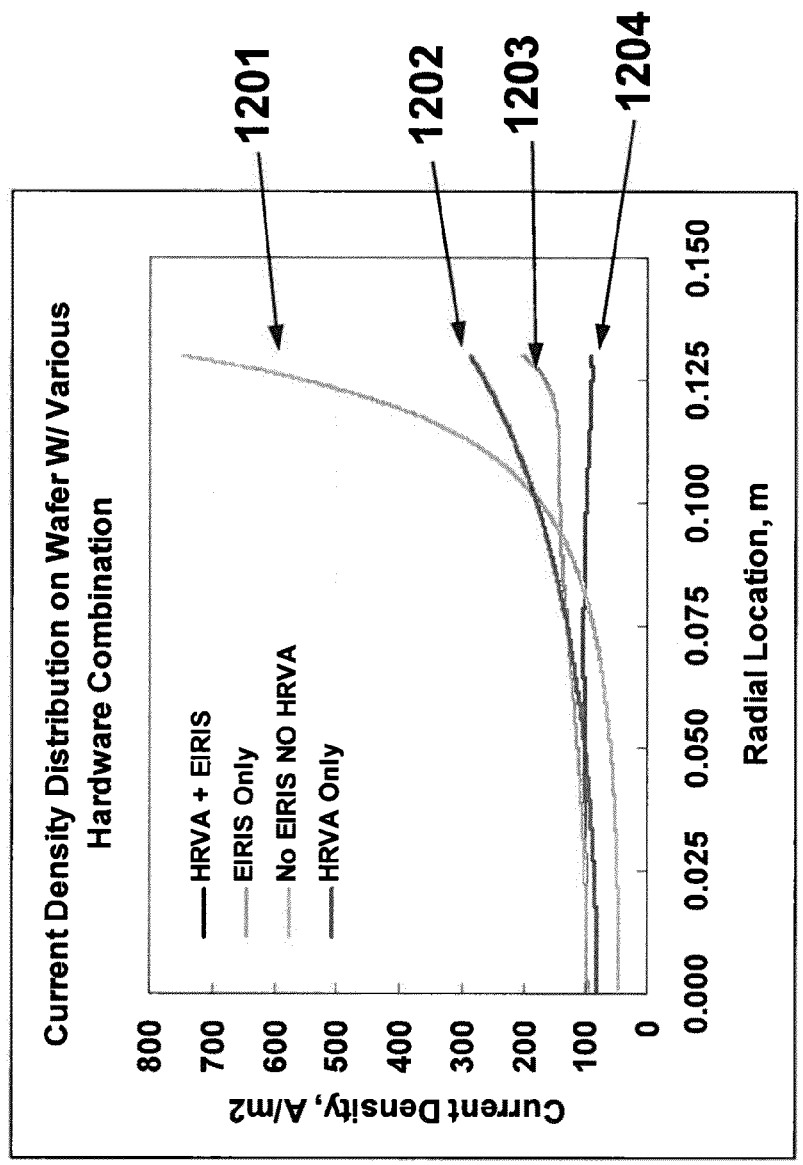
FIG. 12 is a plot of the results of finite element modeling, showing current density versus radial location.

FIG. 12 shows the results of simulations of the initial current density on a 50 Å seed wafer with the physical layout and with properties as depicted and discussed with reference to FIG. 11. In addition, the wafer was set to a ground potential (zero volts), the anode at 50V, and the voltage on the auxiliary physical electrode to 18V. Curve 1201 is the simulation result when the cell had no HRVA and no auxiliary electrode current (the electrode was removed from the system, but the virtual electrode cavity remained). The current density is non-uniform center to edge. The center current is very low, and the edge current very high, with a monotonic transition between the center to edge, with a greater than 14 fold difference between the center current density to current density at 125 mm. Curve 1202 had the HRVA added to the system, but not the auxiliary electrode. The shape of the curve is generally similar to curve 1201, though the center current is markedly higher, and the edge current much lower. The current at 125 mm is now only about 3 times that of the center current density. Still, for this high sheet resistance film, such a result would be unsatisfactory.

Curve 1203 shows the results obtained if the auxiliary cathode was energized and the HRVA was removed from the system. The uniformity is marginally improved with respect to the HRVA only system, though the monotonic shape of the curve is lost. From the center to the about 40 mm, like in all other cases, the distribution is quite flat, though here, the current density is higher than in curve 1201 and slightly higher than in 1202. However, curve 1203 has a double plateau shape, with a second region of approximately constant current density from a radius of about 60 mm to 110 mm, before finally increasing quite rapidly beyond this radius. The total difference in current density between the center and 125 mm is greater than 2x, a slight improvement over curve 1202. This result indicates the significant benefit of using an auxiliary cathode chamber above the anode, even without also using an HRVA. However, current distributions that are bimodal or have a non-monotonic multiple plateau distribution are generally harder to match and process by subsequent metal removal processes (e.g. CMP), so the reduction in range at the expense of the curve shape may not be as beneficial as simply obtaining a relatively smooth monotonic profile with a slightly greater range.

Finally, curve 1204 shows the case where both a HRVA and an auxiliary electrode were employed. In agreement with the experimental data, the distribution is flat all the way from center to the edge of the wafer, varying by less than 3%.

Conclusion

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims. Further it is understood that many features presented in this application can be practiced separately as well as in any suitable combination with each other, as will be understood by one of skill in the art.

What is claimed is:

1. An apparatus for electroplating metal onto a substrate, the apparatus comprising:
   (a) a plating chamber configured to contain an electrolyte and an anode while electroplating metal onto the substrate;
   (b) a substrate holder configured to hold the substrate such that a plating face of the substrate is positioned at a defined distance from the anode during electroplating, the substrate holder having one or more electrical power contacts positioned around a substantially circular perimeter and arranged to contact an edge of the substrate and provide electrical current to the substrate during electroplating;
   (c) an ionically resistive ionically permeable element shaped and positioned between the substrate and the anode during electroplating, the ionically resistive ionically permeable element having a substantially flat surface that is substantially parallel to and separated from a plating face of the substrate, wherein the ionically resistive ionically permeable element has an ionically resistive body with a plurality of perforations made in the body such that the perforations do not form communicating channels within the body and wherein said perforations allow for transport of ions through the element;
   (d) a variable field shaping element positioned between the ionically resistive ionically permeable element and the position of the anode for electroplating; and
   (e) a first auxiliary cathode located between the anode and the ionically resistive ionically permeable element, and peripherally oriented to shape the current distribution from the anode, while the first auxiliary cathode is supplied with current during electroplating; and
   (f) a second auxiliary cathode positioned to be located between the ionically resistive ionically permeable element and the substrate during electroplating, wherein the second auxiliary cathode is adapted to divert a portion of ionic current from an edge region of the substrate.

2. The apparatus of claim 1, wherein the field shaping element is made from a dielectric material.

3. The apparatus of claim 1, wherein the field shaping element comprises a mechanical iris configured to change the size of an aperture.

4. The apparatus of claim 1, wherein the field shaping element comprises a strip having different sizes of apertures and configured to be shifted to vary the size of an aperture that is aligned with the substrate when held by the substrate holder.

5. The apparatus of claim 1, further comprising a mechanism for rotating at least one of the field shaping element and the substrate holder with respect to one another.

6. The apparatus of claim 1, further comprising a mechanism for raising and lowering the field shaping element to vary a distance that separates the field shaping element from the substrate.

7. The apparatus of claim 1, wherein the flat surface of the ionically resistive ionically permeable element is separated from a plating face of the substrate by a gap of about 5millimeters or less during electroplating.

8. The apparatus of claim 1, wherein substantially all said perforations in the body of the ionically resistive ionically permeable element have a principal dimension or a diameter of the opening on the surface of the element facing the surface of the substrate of no greater than about 5 millimeters.

9. The apparatus of claim 1, wherein the ionically resistive ionically permeable element is a disk having between about 6,000-12,000 perforations.

10. The apparatus of claim 1, wherein the ionically resistive ionically permeable element has a porosity of about 5% porous or less.

11. The apparatus of claim 1, wherein the auxiliary cathode is a virtual auxiliary cathode having an associated physical cathode housed in a cavity in the plating chamber, wherein the cavity is in ionic communication with the plating chamber.

12. The apparatus claim 1, further comprising a second ionically resistive ionically permeable element, wherein the second ionically resistive element is positioned proximate the first auxiliary cathode.

13. The apparatus of claim 1, further comprising a control circuit designed or configured to control electrical power delivered to the auxiliary cathode such that the power is delivered only in the beginning of electroplating, but not for the entire time of electroplating the substrate.

14. The apparatus of claim 13, wherein the control circuit is designed or configured to supply no current or substantially no current is supplied to the auxiliary cathode after metal is plated onto the substrate for a period of about 5 seconds or less.

15. The apparatus of claim 14, wherein the control circuit is programmed to supply no current or substantially no current to the first auxiliary cathode after metal is plated onto the substrate for a period of about 5 seconds or less.

16. The apparatus of claim 13, wherein the control circuit is designed or configured to supply current to the first auxiliary cathode and the substrate at a ratio of at least about 1:2 when plating begins.

17. The apparatus of claim 1, wherein the distance between the first auxiliary cathode and a lower surface of the ionically resistive ionically permeable element is less than about a radius of the substantially circular perimeter around which the one or more electrical power contacts are positioned.

18. A method of plating a metal layer onto a substrate, the method comprising:

(a) holding a substrate, having a working surface comprising conductive seed and/or barrier layer, in a substrate holder of an electroplating apparatus, wherein the apparatus comprises a plating chamber, an anode, and a variable field shaping element, a first auxiliary cathode and a second auxiliary cathode;

(b) immersing the working surface of the substrate in an electrolyte solution and proximate an ionically resistive ionically permeable element positioned between the working surface and the anode contained in the plating chamber, the ionically resistive ionically permeable element having a flat surface that is parallel to and separated from the working surface of the substrate, wherein the variable field shaping element is positioned between the ionically resistive ionically permeable element and the position of the anode for electroplating; and wherein the ionically resistive ionically permeable element has an ionically resistive body with a plurality of perforations made in the body such that the perforations do not form communicating channels within the body and wherein said perforations allow for transport of ions through the element;

(c) supplying current to the substrate with one or more electrical power contacts positioned around a substantially circular perimeter to plate the metal layer onto the seed and/or barrier layer;

(d) supplying current to an auxiliary cathode located between the anode and the ionically resistive ionically permeable element, to thereby shape the current distribution from the anode; and (e) supplying current to the second auxiliary cathode located between the substrate and the ionically resistive ionically permeable element to divert a portion of ionic current from the edge portion of the substrate.

19. An apparatus for electroplating metal onto a substrate, the apparatus comprising:

(a) a planting chamber configured to contain an electrolyte and a anode while electroplating metal onto the substrate;

(b) a substrate holder configured to hold the substrate such that a plating face of the substrate is positioned at a defined distance from the anode during electroplating, the substrate holder having one or more electrical power contacts positioned around a substantially circular perimeter and arranged to contact an edge of the substrate and provide electrical current to the substrate during electroplating;

(c) an ionically resistive ionically permeable element shaped and positioned between the substrate and the anode during electroplating, the ionically resistive ionically permeable element having a substantially flat upper surface that is substantially parallel to and separated from a plating face of the substrate, wherein the ionically resistive ionically permeable element has an ionically resistive body with a plurality of perforations made in the body such that the perforations do not form communicating channels within the body and wherein said perforations allow for transport of ions through the element;

(d) a variable field shaping element positioned between the ionically resistive ionically permeable element and the position of the substrate holder; and (e) a first auxiliary cathode located between the anode and the ionically resistive ionically permeable element, and peripherally oriented to shape the current distribution from the anode, while the first auxiliary cathode is supplied with current during electroplating (f) a second auxiliary cathode positioned to be located between the ionically resistive ionically permeable element and the substrate during electroplating, wherein the second auxiliary cathode is adapted to divert a portion of ionic current from an edge region of the substrate.

20. The apparatus of claim 19, wherein the distance between the first auxiliary cathode and a lower surface of the ionically resistive ionically permeable element is less than about a radius of the substantially circular perimeter around which the one or more electrical power contacts are positioned.

* * * * *